(12) United States Patent
Masuyama et al.

(10) Patent No.: US 12,501,569 B2
(45) Date of Patent: Dec. 16, 2025

(54) ELECTRONIC DEVICE

(71) Applicant: Mitsubishi Electric Corporation, Tokyo (JP)

(72) Inventors: Takahiro Masuyama, Tokyo (JP); Hirokazu Takabayashi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 162 days.

(21) Appl. No.: 18/556,712

(22) PCT Filed: Jun. 16, 2021

(86) PCT No.: PCT/JP2021/022789
§ 371 (c)(1),
(2) Date: Oct. 23, 2023

(87) PCT Pub. No.: WO2022/264297
PCT Pub. Date: Dec. 22, 2022

(65) Prior Publication Data
US 2024/0244765 A1     Jul. 18, 2024

(51) Int. Cl.
*G06F 1/16* (2006.01)
*H05K 5/00* (2025.01)
(Continued)

(52) U.S. Cl.
CPC ............. *H05K 5/10* (2025.01); *H05K 7/1432* (2013.01); *H05K 7/20336* (2013.01); *H05K 7/20409* (2013.01)

(58) Field of Classification Search
CPC .... H05K 5/10; H05K 7/1432; H05K 7/20336; H05K 7/20409
See application file for complete search history.

(56) References Cited

U.S. PATENT DOCUMENTS 5,091,823 A * 2/1992 Kanbara .............. H05K 9/0022
                                                    361/736
10,518,660 B2 * 12/2019 Takahashi ................ H02B 1/26
(Continued)

FOREIGN PATENT DOCUMENTS

| JP | 2000150776 A | 5/2000 |
|----|--------------|--------|
| JP | 2006121847 A | 5/2006 |
| JP | 2013163503 A | 8/2013 |

OTHER PUBLICATIONS

International Search Report (PCT/ISA/210) with translation and Written Opinion (PCT/ISA/237) mailed on Sep. 7, 2021 by the Japanese Patent Office as the International Searching Authority for International Application No. PCT/JP2021/022789 (9 pages).
(Continued)

*Primary Examiner* — Anthony M Haughton
(74) *Attorney, Agent, or Firm* — Buchanan Ingersoll & Rooney PC

(57) ABSTRACT

An electronic device includes a housing accommodating a plurality of electronic components, a base to which at least two of the plurality of electronic components are attached, and a partition assembly separating at least one electronic component of the at least two electronic components attached to the base from another electronic component of the at least two electronic components attached to the base. The partition assembly includes a first partition and a second partition. The first partition separates the at least one electronic component of the at least two electronic components from the other electronic component of the at least two electronic components. The second partition is located adjacent to the first partition and closes at least a part of a gap between the first partition and the housing.

20 Claims, 23 Drawing Sheets

(51) Int. Cl.
    *H05K 5/10*        (2025.01)
    *H05K 7/00*        (2006.01)
    *H05K 7/14*        (2006.01)
    *H05K 7/20*        (2006.01)

(56) References Cited

U.S. PATENT DOCUMENTS

| | | | |
|---|---|---|---|
| 10,590,940 B2 * | 3/2020 | Santolucito | H05K 7/20163 |
| 10,945,355 B2 * | 3/2021 | Kitanaka | H02M 7/003 |
| 2014/0233183 A1 * | 8/2014 | Horng | G06F 1/203 |
| | | | 361/692 |
| 2014/0345492 A1 | 11/2014 | Fujito et al. | |
| 2015/0062811 A1 * | 3/2015 | Suzuki | H05K 7/2089 |
| | | | 361/690 |
| 2018/0191183 A1 * | 7/2018 | Namiki | H05K 7/20145 |
| 2019/0208671 A1 * | 7/2019 | Kitanaka | H05K 7/20209 |

OTHER PUBLICATIONS

Notice of Reasons for Refusal with translation dated Aug. 22, 2023 issued by the Japanese Patent Office in corresponding Japanese Patent Application No. 2023-528829. (8 pages).

Notice of Reasons for Refusal dated Jan. 9, 2024, issued in the corresponding Japanese Patent Application No. 2023-528829, 8 pages including 4 pages of English Translation.

* cited by examiner

FIG.13
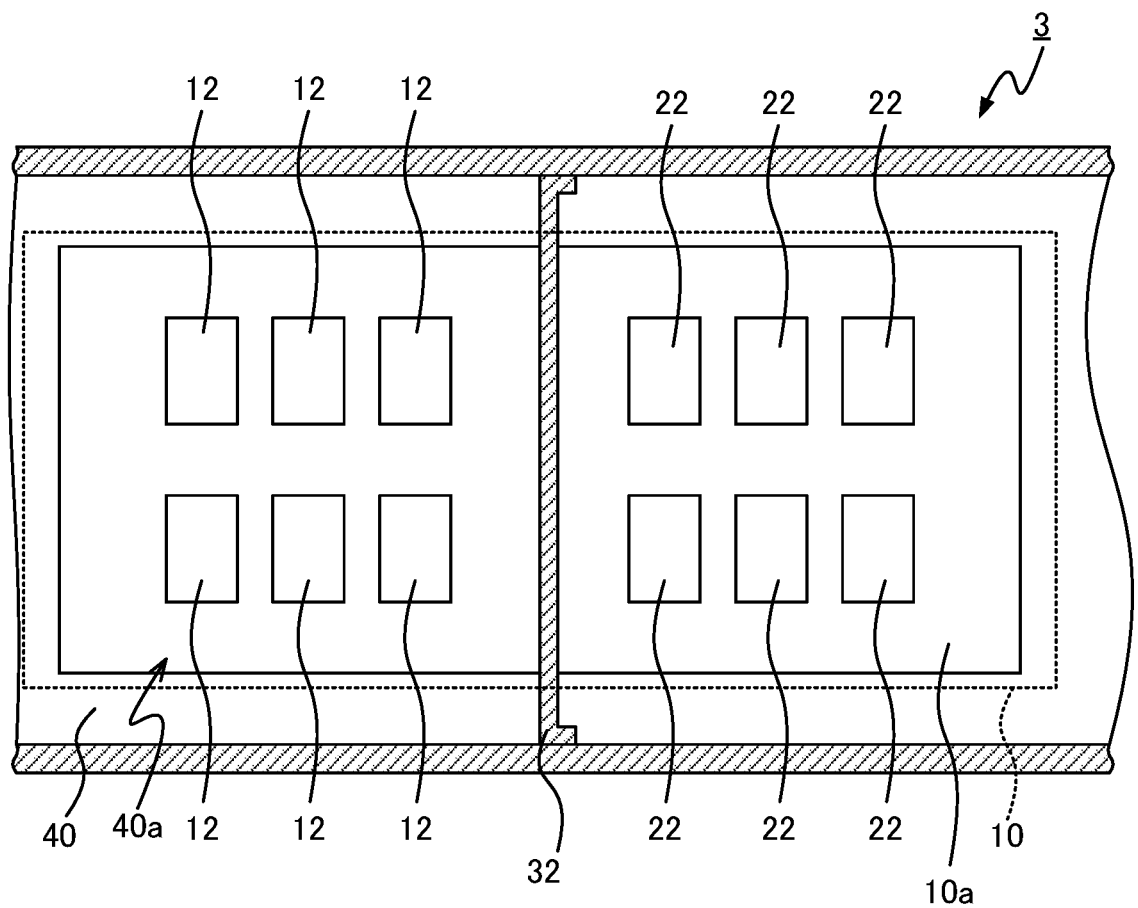
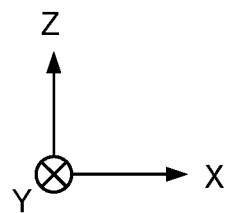

FIG.19
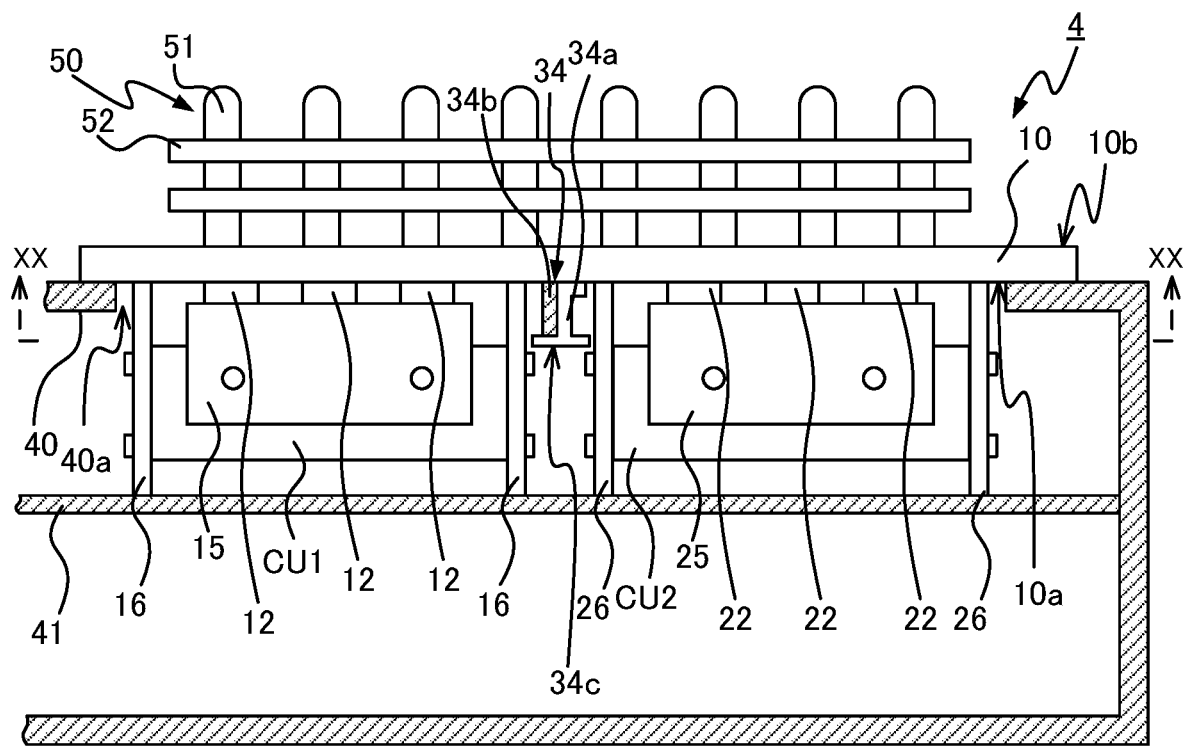
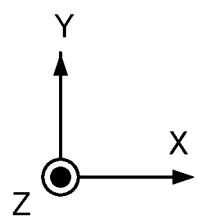

ELECTRONIC DEVICE

TECHNICAL FIELD

The present disclosure relates to an electronic device.

BACKGROUND ART

An electronic device, such as a propulsion controller or a power supply device installed on a railway vehicle, includes a housing accommodating multiple electronic components. Patent Literature 1 describes an example of such an electronic device. A vehicle driving controller described in Patent Literature 1 as an example of an electronic device includes multiple semiconductor elements accommodated in a housing and attached to a cooling block, and an insulator located between the semiconductor devices to prevent pieces of any broken semiconductor device from scattering and damaging other semiconductor devices.

CITATION LIST

Patent Literature

Patent Literature 1: Unexamined Japanese Patent Application Publication No. 2013-163503

SUMMARY OF INVENTION

Technical Problem

When, for example, an electronic device has an overcurrent, the electronic device stops, but the overcurrent may break semiconductor devices, causing scattering of broken pieces of the semiconductor devices. An insulator included in a vehicle driving controller described in Patent Literature 1 is attached to a cooling block between the semiconductor devices, and leaves a gap between the insulator and a housing. This gap may allow scattering pieces of one semiconductor device to pass through between the insulator and the housing and come in contact with another semiconductor device, and may break the other semiconductor device. This issue is common to the semiconductor device as well as to electronic components included in an electronic device.

In response to the above circumstances, an objective of the present disclosure is to provide an electronic device that suppresses pieces of any electronic component included in the electronic device scattering and coming in contact with other electronic components.

Solution to Problem

To achieve the above objective, an electronic device according to an aspect of the present disclosure includes a housing, a base, and a partition assembly. The housing accommodates a plurality of electronic components. The base is removably attached to the housing and at least two of the plurality of electronic components are attached to the base. The partition assembly separates at least one electronic component of the at least two electronic components attached to the base from another electronic component of the at least two electronic components attached to the base. The partition assembly includes a first partition and a second partition. The first partition is located to separate the at least one electronic component of the at least two electronic components from the another electronic component of the at least two electronic components. The second partition is located adjacent to the first partition and closes at least a part of a gap between the first partition and the housing.

Advantageous Effects of Invention

The partition assembly included in the electronic device according to the above aspect of the present disclosure includes the first partition that separates at least one electronic component of at least two electronic components attached to the base from another electronic component, of the at least two electronic components attached to the base and the second partition located adjacent to the first partition and closing at least the part of the gap between the first partition and the housing. This structure can reduce the likelihood that pieces of any electronic component scatter and come in contact with other electronic components.

BRIEF DESCRIPTION OF DRAWINGS

FIG. 13 is a cross-sectional view of the electronic device according to Embodiment 3 taken along line XIII-XIII as viewed in the direction indicated by the arrows in FIG. 11;

FIG. 19 is a cross-sectional view of an electronic device according to a fourth modification of an embodiment;

DESCRIPTION OF EMBODIMENTS

An electronic device according to one or more embodiments of the present disclosure is described below in detail with reference to the drawings. In the figures, the same reference signs denote the same or equivalent components.

Embodiment 1

As an example of an electronic device, a direct current (DC)-three-phase converter is installed on a railway vehicle to convert DC power supplied from a DC power source to three-phase alternating current (AC) power and to supply the AC power to a motor. An electronic device 1 according to Embodiment 1 is described using, in an example, a standby redundant DC-three-phase converter that includes two power converters. One power converter serves as an operation system, and the other power converter serves as a standby system.

Figure 1:
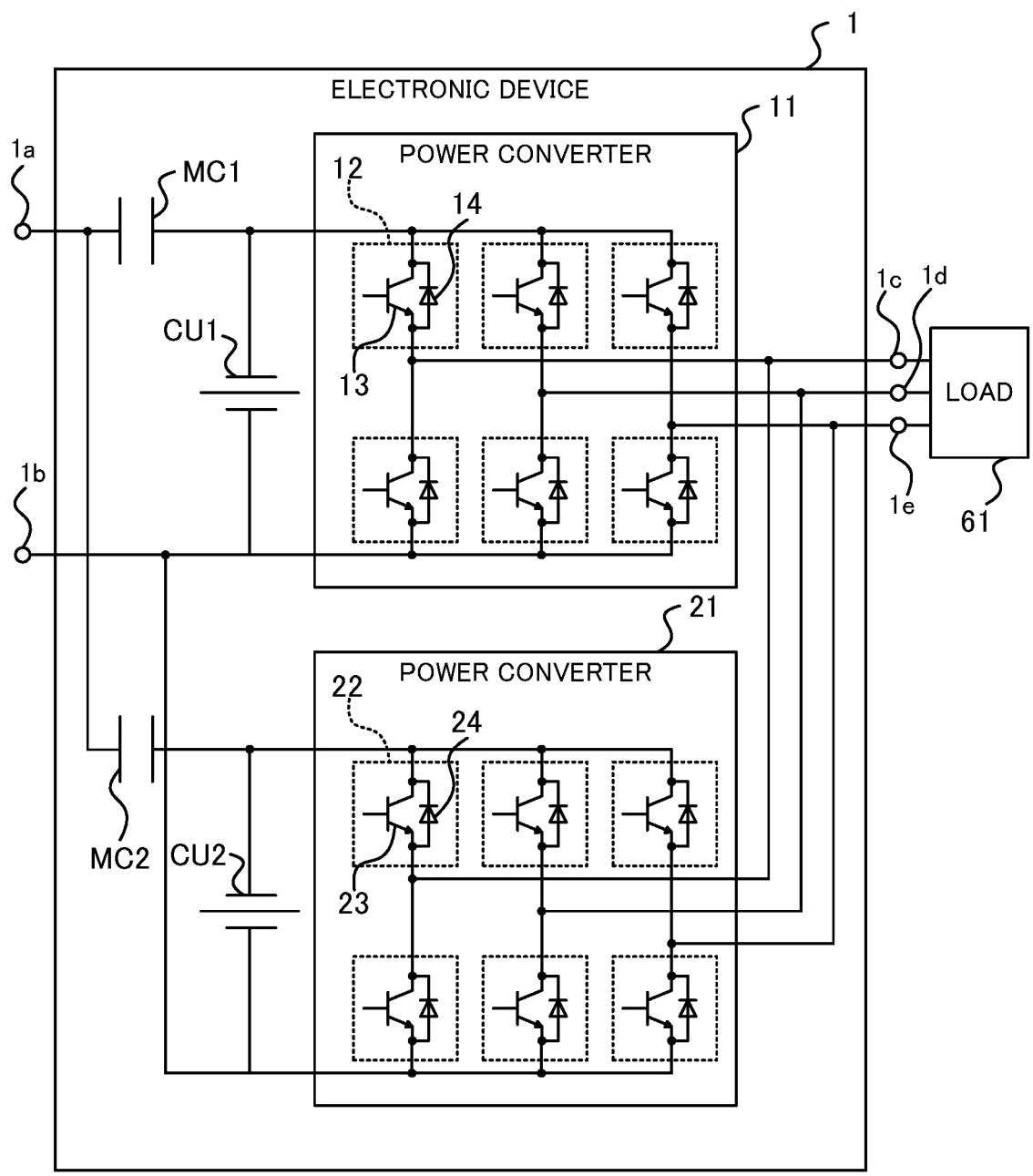
FIG. 1 is a circuit diagram of an electronic device according to Embodiment 1.

The electronic device 1 illustrated in FIG. 1 includes a positive input terminal 1a connected to a power source, a negative input terminal 1b grounded, and output terminals 1c, 1d, and 1e connected to a load 61. The output terminals 1c, 1d, and 1e correspond to a U phase, a V phase, and a W phase of three-phase AC power.

The electronic device 1 receives DC power supply from the power source connected to the positive input terminal 1a, or more specifically, a current collector that acquires power from an electrical substation through a power supply line. The electronic device 1 converts the supplied DC power to three-phase AC power, and supplies the three-phase AC power to the load 61. For example, the power supply line is an overhead power line or a third rail, and the current collector is a pantograph or a contact shoe. The load 61 includes, for example, a three-phase induction motor.

The components of the electronic device 1 are described below. The electronic device 1 includes a first power converter 11, a capacitor CU1, and a contactor MC1. The first power converter 11 converts DC power supplied from the power source to three-phase AC power and supplies the three-phase AC power to the load 61. The capacitor CU1 is connected between a pair of primary terminals of the first power converter 11 that are located near the power source. The contactor MC1 has one end connected to the positive input terminal 1a and the other end connected to a point of connection between a positive terminal of the capacitor CU1 and the primary terminal of the first power converter 11.

The first power converter 11 includes three pairs of switching elements 12 each connected in series. The three pairs of switching elements 12 correspond to the U phase, the V phase, and the W phase of three-phase AC power. The switching elements 12 corresponding to the U phase, the switching elements 12 corresponding to the V phase, and the switching elements 12 corresponding to the W phase are connected in parallel to one another. Each switching element 12 includes an insulated-gate bipolar transistor (IGBT) 13 and a freewheeling diode 14 including an anode connected to an emitter terminal of the IGBT 13 and a cathode connected to a collector terminal of the IGBT 13. A controller (not illustrated) provides a gate signal to a gate terminal of the IGBT 13 included in each switching element 12 included in the first power converter 11 to turn on or off the switching element 12. Each switching element 12 performs switching to cause the first power converter 11 to convert DC power to three-phase AC power.

The capacitor CU1 is charged with DC power supplied from the power source.

The contactor MC1 includes, for example, a DC electromagnetic contactor to electrically connect or disconnect the first power converter 11 and the capacitor CU1 to or from the power source.

The electronic device 1 further includes a second power converter 21, a capacitor CU2, and a contactor MC2. The second power converter 21 converts DC power supplied from the power source to three-phase AC power, and supplies the three-phase AC power to the load 61. The capacitor CU2 is connected between a pair of primary terminals of the second power converter 21 that are located near the power source. The contactor MC2 has one end connected to the positive input terminal 1a and the other end connected to a point of connection between a positive terminal of the capacitor CU2 and the primary terminal of the second power converter 21.

The second power converter 21 includes three pairs of switching elements 22 each connected in series. The three pairs of switching elements 22 connected in series correspond to the U phase, the V phase, and the W phase of three-phase AC power and are connected in parallel to one another. Each switching element 22 includes an IGBT 23 and a freewheeling diode 24 including an anode connected to an emitter terminal of the IGBT 23 and a cathode connected to a collector terminal of the IGBT 23. A controller (not illustrated) provides a gate signal to a gate terminal of each switching element 22 included in the second power converter 21 to turn on or off the switching element 22. Each switching element 22 performs switching to cause the second power converter 21 to convert DC power to three-phase AC power.

The capacitor CU2 is charged with DC power supplied from the power source.

The contactor MC2 includes, for example, a DC electromagnetic contactor to electrically connect or disconnect the second power converter 21 and the capacitor CU2 to or from the power source.

One of the primary terminals of the first power converter 11 is connected to the positive input terminal 1a with the contactor MC1. One of the primary terminals of the second power converter 21 is connected to the positive input terminal 1a with the contactor MC2. In other words, the first power converter 11 and the second power converter 21 are connected commonly to the power source. Secondary terminals of the first power converter 11 and secondary terminals of the second power converter 21 are connected to the output terminals 1c, 1d, and 1e. In other words, the first power converter 11 and the second power converter 21 are connected commonly to the load 61.

One of the first power converter 11 and the second power converter 21 serves as an operation system, and the other serves as a standby system. In the example described below, the first power converter 11 serves as an operation system, and the second power converter 21 serves as a standby system. In other words, during the operation of the first power converter 11, the second power converter 21 is stopped. More specifically, during the contactor MC1 being turned on, the contactor MC2 remains open, and the second power converter 21 receives no power.

For example, when the first power converter 11 has an overcurrent to stop the first power converter 11 and the contactor MC1 is open, the contactor MC2 is turned on to supply power to the second power converter 21, and the second power converter 21 starts operating. An overcurrent may break an electronic component included in the electronic device 1, for example, one switching element 12, causing scattering of broken pieces of the switching element 12. When the scattering pieces of the switching element 12 come in contact with another electronic component such as a switching element 22, the switching element 22 is broken, and the second power converter 21 fails to start operating. The electronic device 1 thus has the structure to reduce the likelihood of scattering of broken pieces of any electronic component.

The structure of the electronic device 1 is described in detail below. To simplify the drawings, FIGS. 2, 3, and FIG. 4 that is a cross-sectional view taken along line IV-IV as viewed in the direction indicated by the arrows in FIG. 2 simply illustrate the capacitors CU1 and CU2 and the switching elements 12 and 22 among the components of the electronic device 1 illustrated in FIG. 1. The same applies to the subsequent figures. Parts of a housing 40 and a fixing frame 41 are not illustrated in FIG. 3.

Figure 2:
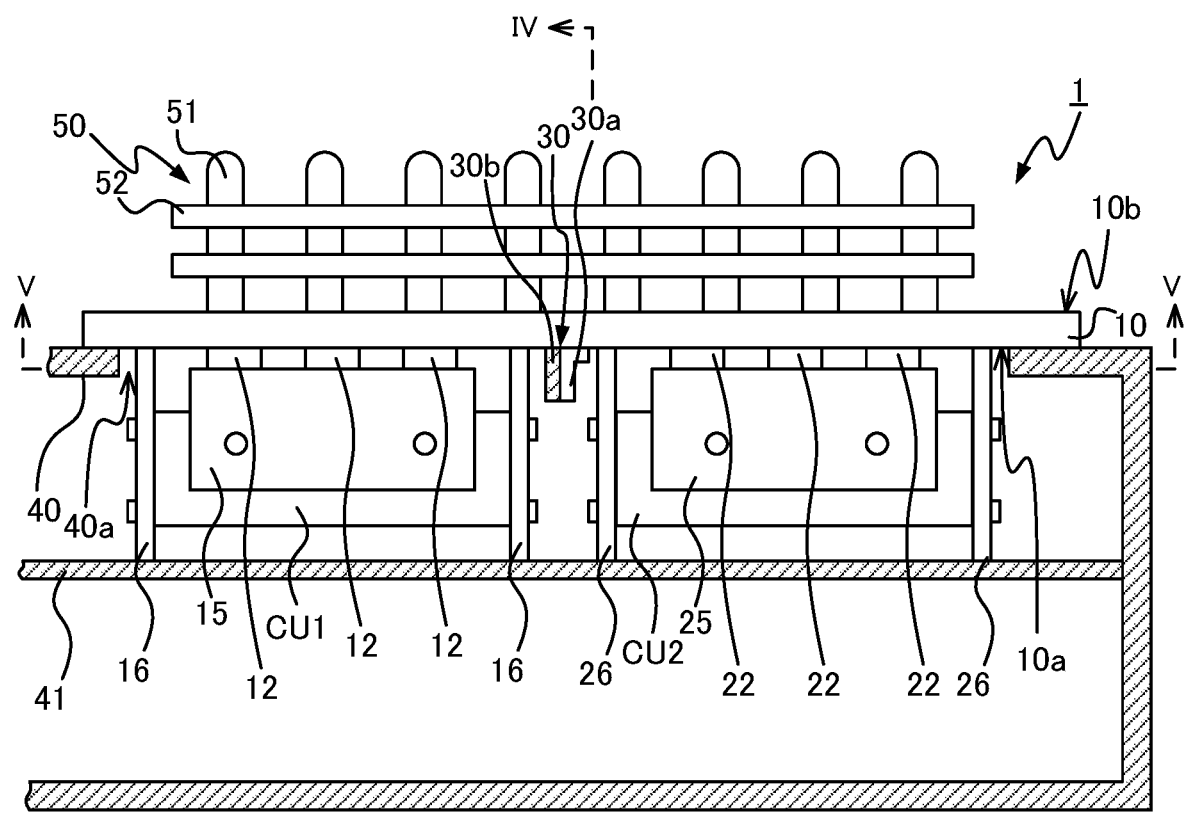
FIG. 2 is a cross-sectional view of the electronic device according to Embodiment 1.
Figure 3:
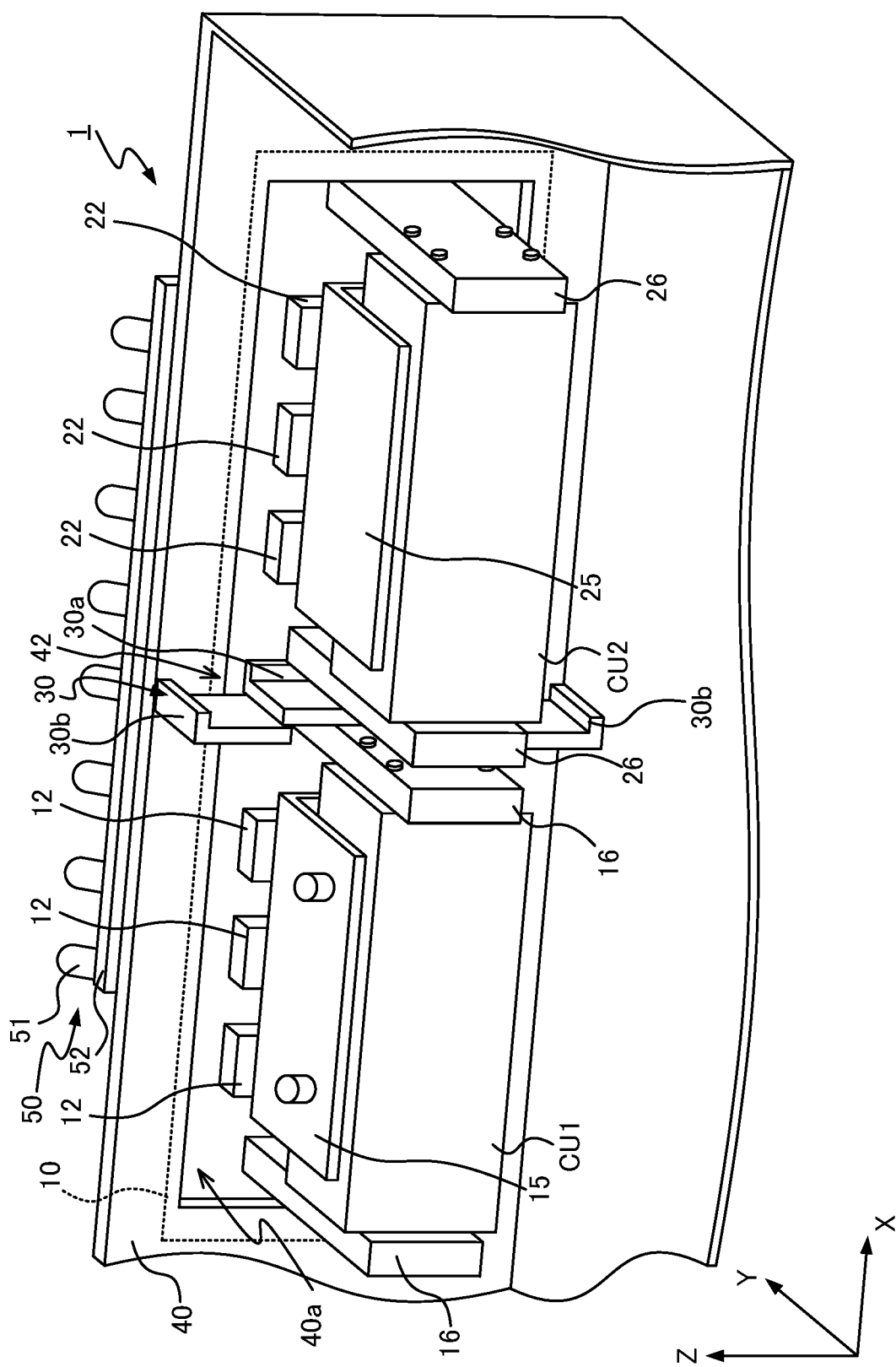
FIG. 3 is a perspective view of the electronic device according to Embodiment 1.
Figure 4:
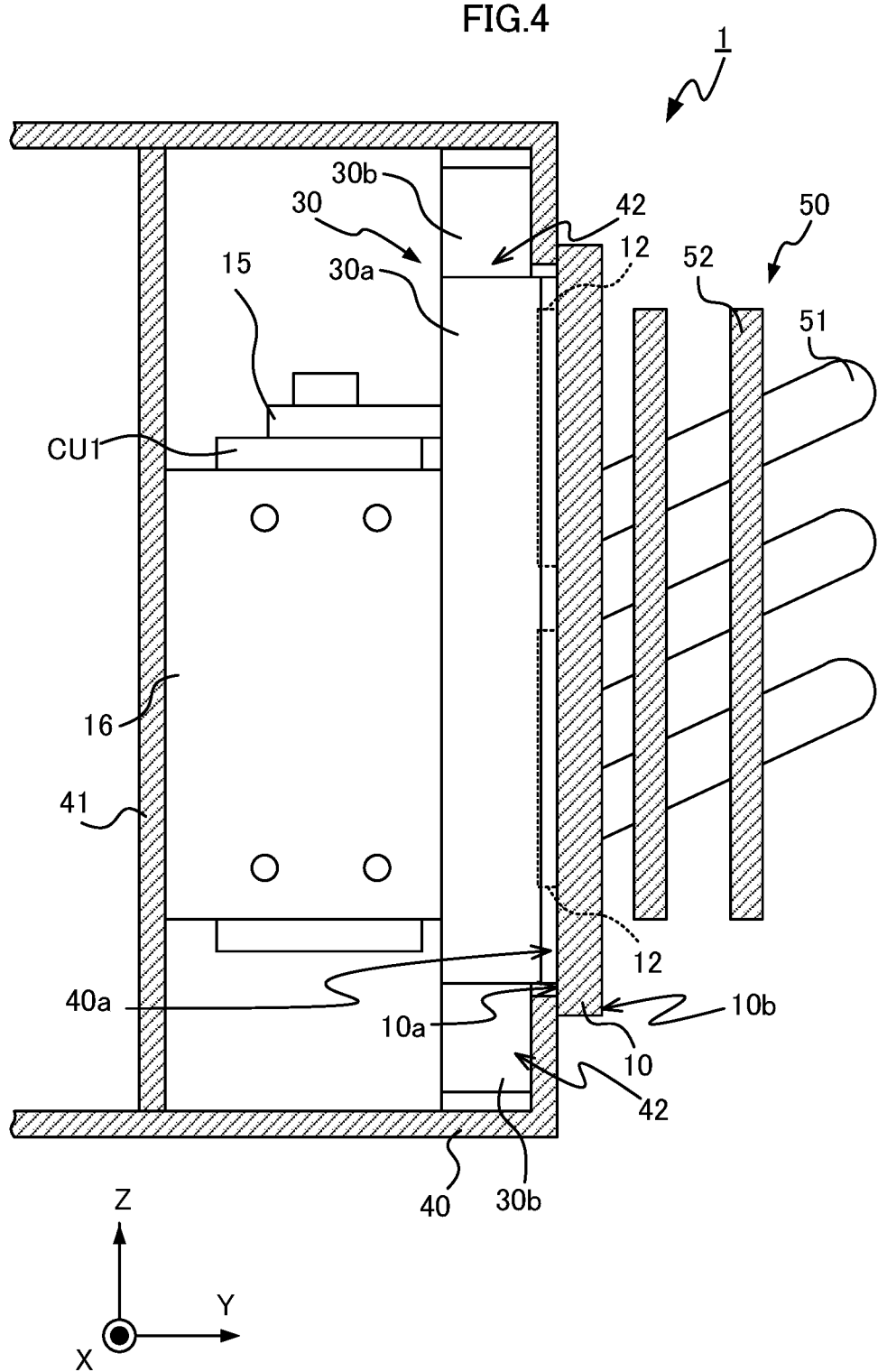
FIG. 4 is a cross-sectional view of the electronic device according to Embodiment 1 taken along line IV-IV as viewed in the direction indicated by the arrows in FIG. 2.

With reference to FIGS. 2 to 4, X-axis extends in the longitudinal direction of the housing 40, and Y-axis extends in the lateral direction of the housing 40. X-axis corresponds to a direction in which a railway vehicle on which the electronic device 1 is installed travels, and Y-axis corresponds to the width direction of the railway vehicle. X-axis, Y-axis, and Z-axis are perpendicular to one another. When the railway vehicle on which the electronic device 1 is installed is located horizontally, Z-axis extends in the vertical direction. The same applies to the subsequent figures.

The electronic device 1 includes the housing 40 accommodating multiple electronic components, a base 10 removably attached to the housing 40, and a partition assembly 30 that separates the electronic components from one another. The electronic device 1 further includes a busbar 15 that connects the capacitor CU1 to the multiple switching elements 12, a busbar 25 that connects the capacitor CU2 to the multiple switching elements 22, a pair of first attachments 16 that attach the capacitor CU1 to the base 10, and a pair of second attachments 26 that attach the capacitor CU2 to the base 10. The electronic device 1 preferably further includes a cooler 50 attached to the base 10 to cool the electronic components.

The housing 40 is attached under the floor of the railway vehicle. The housing 40 has rigidity and strength enough to resist deformation under the maximum expected vibration from the railway vehicle. For example, the housing 40 is formed from metal such as iron or aluminum. The housing 40 has an opening 40a in the surface intersecting with Y-axis. The housing 40 accommodates the fixing frame 41 to which the pair of first attachments 16 and the pair of second attachments 26 are fixed.

The fixing frame 41 is a plate fixed to the housing 40. The fixing frame 41 has rigidity and strength enough to resist deformation under the maximum expected vibration from the railway vehicle, and is attached to the housing 40 with strength enough not to change the positional relationship between the housing 40 and the fixing frame 41. For example, the fixing frame 41 is formed from metal such as iron or aluminum, and fastened to the housing 40 with a metal fastener.

Figure 5:
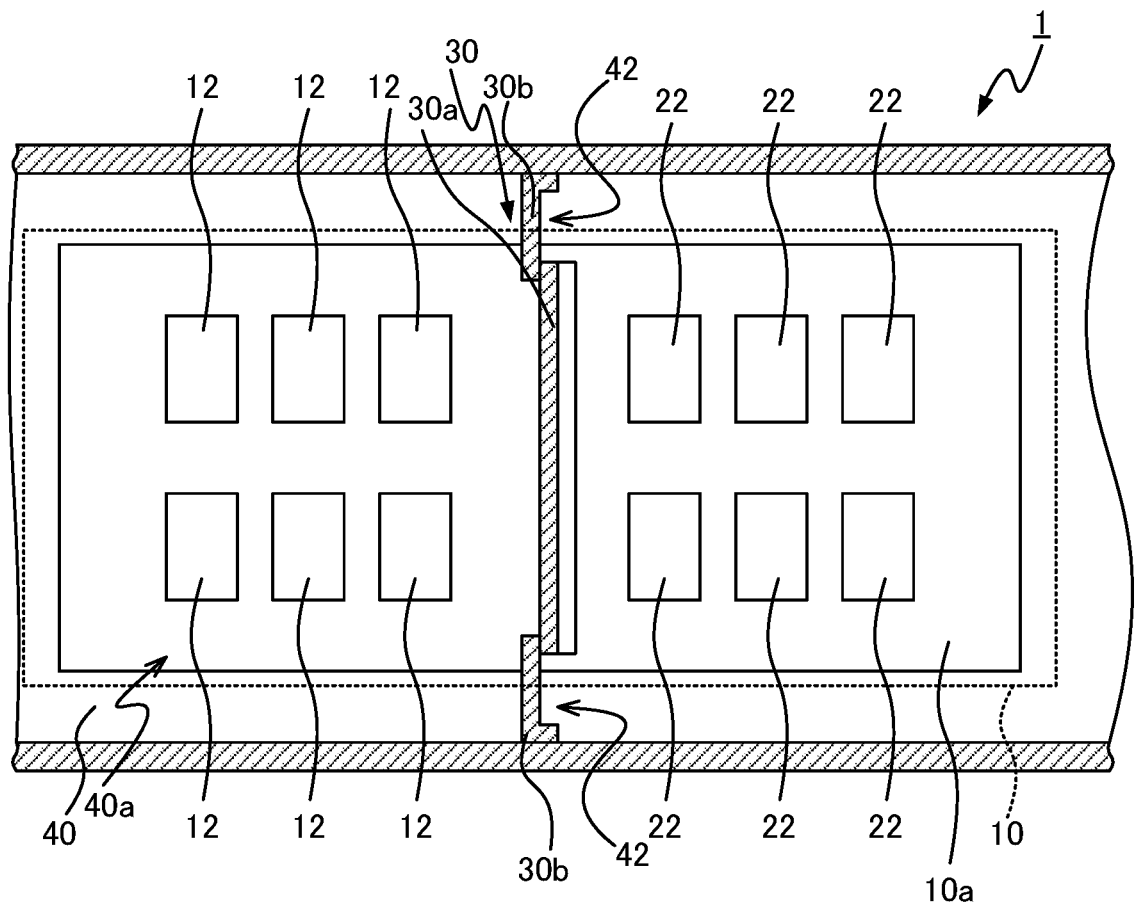
FIG. 5 is a cross-sectional view of the electronic device according to Embodiment 1 taken along line V-V as viewed in the direction indicated by the arrows in FIG. 2.

The base 10 is removably attached to the housing 40 with a first main surface 10a closing the opening 40a in the housing 40. In Embodiment 1, the base 10 is a thermally conductive plate attached to the outer surface of the housing 40 to close the opening 40a. At least two electronic components are attached to the first main surface 10a of the base 10. In Embodiment 1, as illustrated in FIG. 5 that is a cross-sectional view taken along line V-V as viewed in the direction indicated by the arrows in FIG. 2, six switching elements 12 and six switching elements 22 are attached to the first main surface 10a. In addition, the capacitors CU1 and CU2 are attached to the first main surface 10a.

Figure 6:
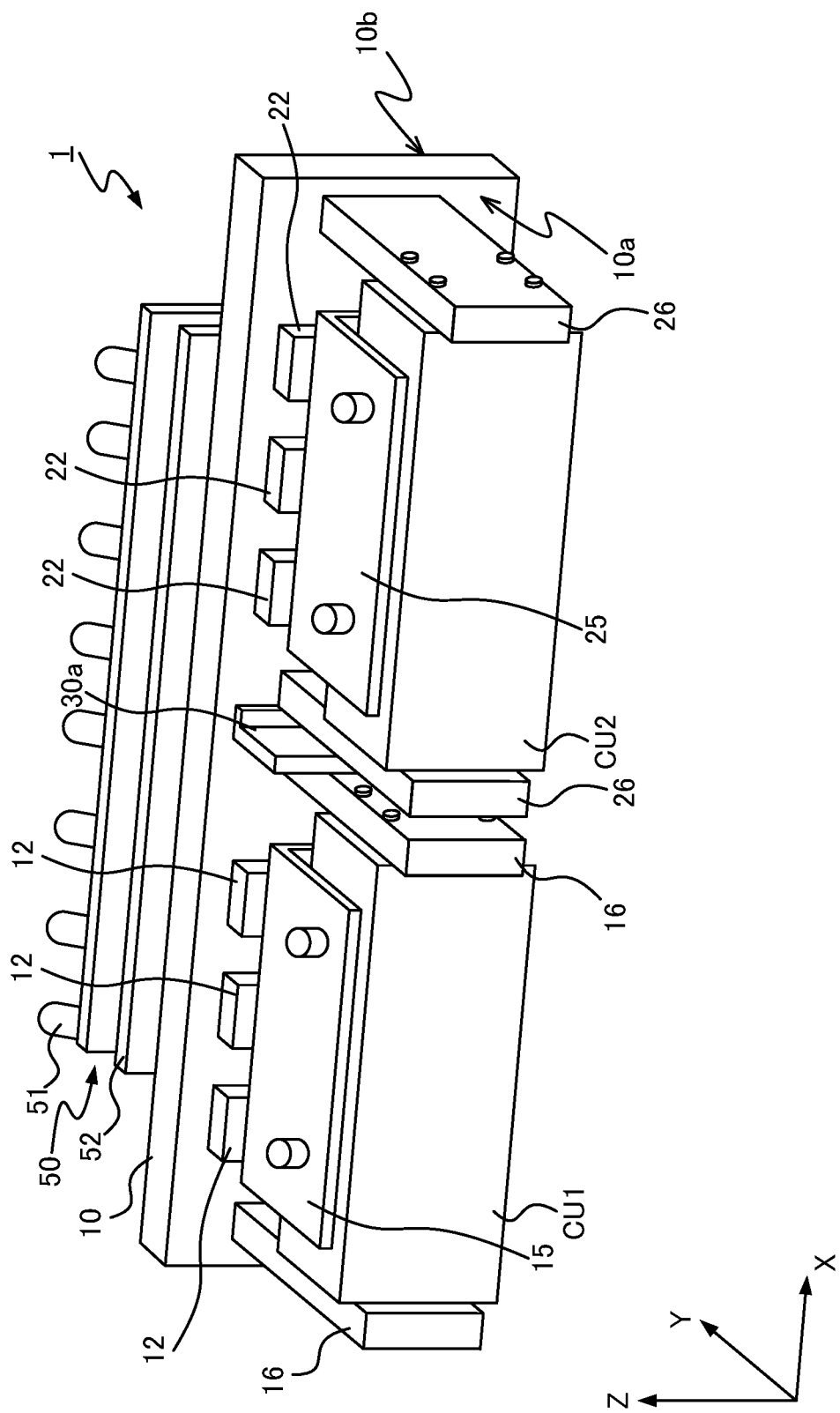
FIG. 6 is a perspective view of electronic components in Embodiment 1.

More specifically, as illustrated in FIG. 6, the capacitor CU1 is attached to the first main surface 10a with the pair of first attachments 16, with the switching elements 12 held between the capacitor CU1 and the base 10. Similarly, the capacitor CU2 is attached to the first main surface 10a with the pair of second attachments 26 with the switching elements 22 held between the capacitor CU2 and the base 10.

The cooler 50 for dissipating heat transferred from at least two electronic components attached to the first main surface 10a is attached to a second main surface 10b opposite to the first main surface 10a.

Figure 7:
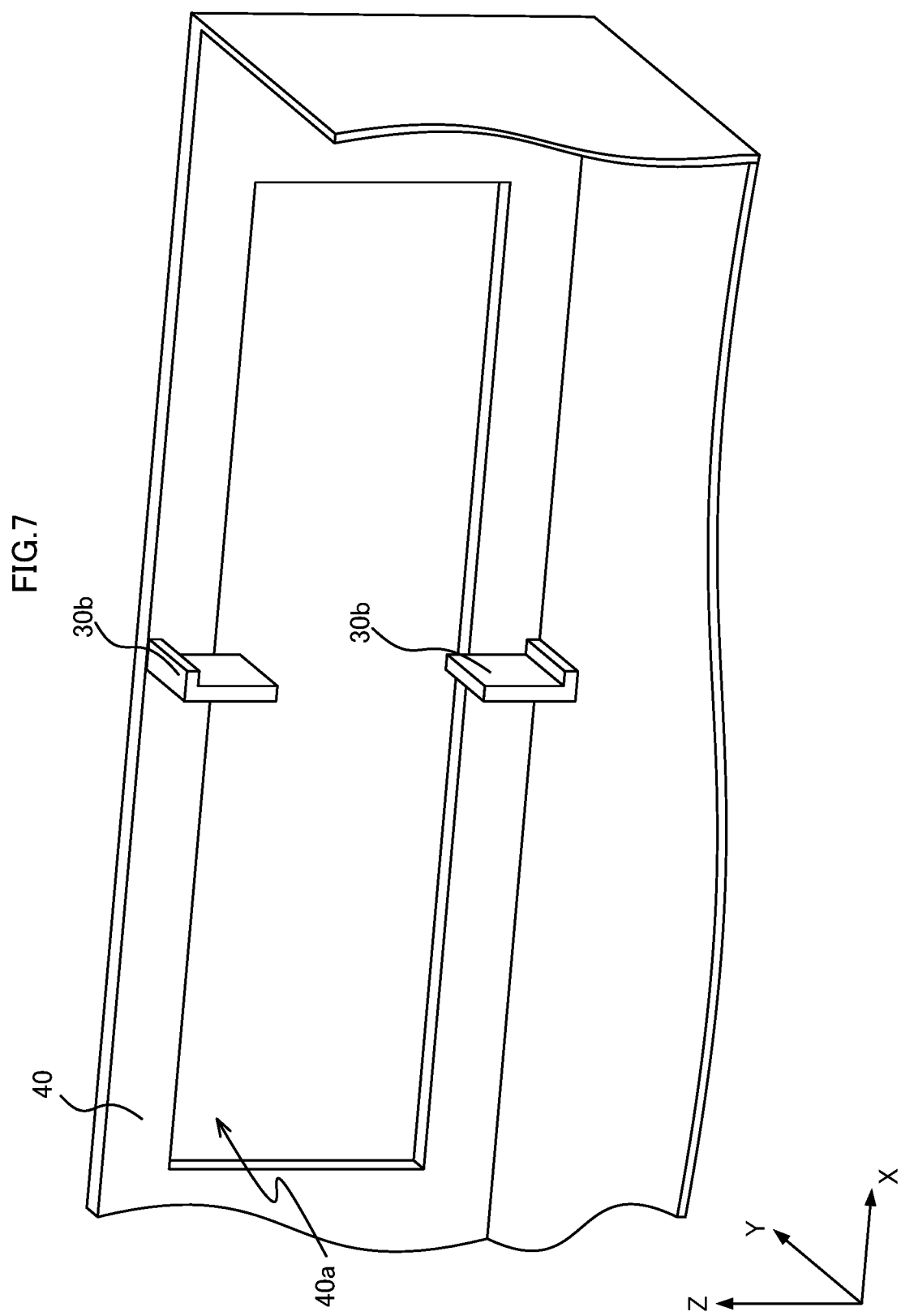
FIG. 7 is a perspective view of a housing and a partition assembly in Embodiment 1.

The base 10 is attached to the outer surface of the housing 40 illustrated in FIG. 7, with the switching elements 12 and 22 and the capacitors CU1 and CU2 attached to the first main surface 10a, and the cooler 50 attached to the second main surface 10b. Thus, as illustrated in FIG. 3, the switching elements 12 and 22, the capacitors CU1 and CU2, the busbars 15 and 25, the first attachments 16, and the second attachments 26 are accommodated in the housing 40.

The base 10 is preferably formed from a highly thermally-conductive material, for example, metal such as copper or aluminum, whose thermal conductivity is high enough to transfer heat from the electronic components attached to the first main surface 10a to the cooler 50.

The busbar 15 electrically connects the output terminals of the capacitor CU1 to the switching elements 12. The busbar 15 is, for example, a laminate busbar including a laminate of multiple conductors and multiple insulating layers. In Embodiment 1, the busbar 15 is bent in an L shape, and electrically connects the output terminals of the capacitor CU1 in an upper portion of the capacitor CU1 in Z-direction to the switching elements 12 attached to the base 10.

The busbar 25 electrically connects the output terminals of the capacitor CU2 to the switching elements 22. The busbar 25 is, for example, a laminate busbar including a laminate of multiple conductors and multiple insulating layers. In Embodiment 1, the busbar 25 is bent in an L shape, and electrically connects the output terminals of the capacitor CU2 in an upper portion of the capacitor CU2 in Z-direction to the switching elements 22 attached to the base 10.

As illustrated in FIGS. 2 to 4, each first attachment 16 is a plate with a main surface parallel to a YZ plane. The pair of first attachments 16 are attached to the capacitor CU1 with the capacitor CU1 held therebetween in X-direction. The pair of first attachments 16 attached to the capacitor CU1 are then attached to the base 10.

Each first attachment 16 has rigidity and strength enough to resist deformation under the maximum expected vibration from the railway vehicle, and is attached to the base 10 with strength enough not to change the positional relationship between the capacitor CU1 and each first attachment 16 and the positional relationship between the base 10 and each first attachment 16. For example, each first attachment 16 is formed from a plate of metal such as iron or aluminum with a thickness greater than or equal to 10 mm, and is fastened by a fastener with a side surface in contact with the first main surface 10a and thus is attached to the base 10.

Each second attachment 26 is a plate having a main surface parallel to the YZ plane. The pair of second attachments 26 are attached to the capacitor CU2 with the capacitor CU2 held therebetween in X-direction. The pair of second attachments 26 attached to the capacitor CU2 are then attached to the base 10.

Each second attachment 26 has rigidity and strength enough to resist deformation under the maximum expected vibration from the railway vehicle, and is attached to the base 10 with strength not to change the positional relationship between the capacitor CU2 and each second attachment 26 and the positional relationship between the base 10 and each second attachment 26. For example, each second attachment 26 is formed from a plate of metal such as iron or aluminum with a thickness greater than or equal to 10 mm, and is fastened by a fastener with a side surface in contact with the first main surface 10a and thus is attached to the base 10.

The cooler 50 includes heat pipes 51 attached to the base 10 and multiple fins 52 attached to the heat pipes 51 with the heat pipes 51 extending through the fins 52. Each heat pipe 51 includes a header attached to the base 10 and extending in X-direction, and a branch pipe continuous with the header and extending vertically upward away from the base 10. The header is received in a groove on the base 10, and fixed to the base 10 by, for example, bonding with an adhesive or soldering. The branch pipe is attached to the header by welding or soldering to be continuous with the header.

The header and the branch pipe included in each heat pipe 51 are formed from a highly thermally conductive material, for example, metal such as copper or aluminum. Each heat pipe 51 contains a coolant. The coolant is an object, such as water, that evaporates with heat transferred from the electronic components, and liquefies by dissipating heat into air around the cooler 50 through the heat pipes 51 and the fins 52.

When heat is transferred to the coolant from the switching elements 12 and 22 attached to the first main surface 10a through the base 10 and the headers in the heat pipes 51, the coolant evaporates. The evaporated coolant moves upward in Z-direction in the heat pipe 51. The coolant transfers heat to the air around the cooler 50 through the branch pipes in the heat pipes 51 and the fins 52 while moving upward in Z-direction, and is cooled and liquefies. The liquefied coolant moves downward in Z-direction along inner walls of the heat pipes 51. As described above, the coolant circulates while repeatedly evaporating and liquefying to transfer heat generated in the switching elements 12 and 22 to air around the cooler 50, and to cool the switching elements 12 and 22.

The partition assembly 30 to prevent scattering of broken pieces of any electronic component includes a first partition 30a and second partitions 30b. The first partition 30a is located to separate at least one electronic component of at least two electronic components attached to the base 10 from another electronic component of the at least two electronic components attached to the base 10. The second partitions 30b are located adjacent to the first partition 30a and close at least parts of gaps between the first partition 30a and the housing 40.

In Embodiment 1, the partition assembly 30 includes the first partition 30a and two second partitions 30b. The first partition 30a is a plate attached to the base 10. The two second partitions 30b are plates holding the first partition 30a therebetween in the direction along the main surface of the first partition 30a.

The first partition 30a is attached to the first main surface 10a of the base 10, and extends away from the base 10. One main surface of the first partition 30a, or more specifically, the surface of the first partition 30a facing in the negative X-direction faces the switching elements 12. Facing the switching elements 12 includes facing the switching elements 12 directly without other components between the first partition 30a and the switching elements 12, and indirectly with other components between the first partition 30a and the switching elements 12.

The other main surface of the first partition 30a, or more specifically, the surface of the first partition 30a facing in the positive X-direction faces the switching elements 22. Facing the switching elements 22 includes facing the switching elements 22 directly without other components between the first partition 30a and the switching elements 22, and indirectly with other components between the first partition 30a and the switching elements 22. The first partition 30a located in the above manner separates the switching elements 12 from the switching elements 22.

The first partition 30a attached to the base 10 passes through the opening 40a, and thus has a dimension in Z-direction less than or equal to the dimension of the opening 40a in Z-direction. To prevent scattering of pieces of any electronic component, the first partition 30a preferably has a maximum dimension in Z-direction that allows the first partition 30a to pass through the opening 40a. The first partition 30a preferably has strength enough to prevent scattering pieces of any electronic component from breaking through the first partition 30a. For example, the first partition 30a may be a metal plate with a thickness or a dimension in X-direction of 1 to 5 mm inclusive.

More specifically, the first partition 30a is a thin metal plate with a bent end. The bent end is in contact with the base 10 and attached to the base 10 with a fastener. The main surface of the metal plate excluding the end faces the main surface of each second partition 30b. The first partition 30a formed from highly thermally conductive metal dissipates heat of air in the housing 40 into air around the cooler 50 from the cooler 50 through the first partition 30a and the base 10, and thus can cool the air in the housing 40.

As illustrated in FIGS. 3 to 5 and 7, the two second partitions 30b are attached to the housing 40, and close at least parts of the gaps between the first partition 30a and the housing 40. More specifically, one of the second partitions 30b closes a gap 42 between the housing 40 and the vertically upper end of the first partition 30a. The other of the second partitions 30b closes a gap 42 between the housing 40 and the vertically lower end of the first partition 30a. Closing the gaps 42 refers to making the gaps 42 narrow enough to prevent the broken pieces of any electronic component from passing through and coming in contact with the other electronic components. In other words, the second partitions 30b may not completely close the gaps 42. In Embodiment 1, the second partitions 30b suppress broken pieces of the switching elements 12 or 22 passing through the gaps 42 in X-direction.

Each second partition 30b is attached to the housing 40 by, for example, welding, bonding, or fastening with a fastener. In Embodiment 1, one of the second partitions 30b is attached to a vertically upper portion of the housing 40 and the surface having the opening 40a. The other of the second partitions 30b is attached to a vertically lower portion of the housing 40 and the surface having the opening 40a. The second partitions 30b preferably have strength enough to prevent scattering pieces of any electronic component from breaking through the second partitions 30b. For example, the second partitions 30b may each be a metal plate with a thickness or a dimension in X-direction of 1 to 5 mm inclusive.

More specifically, each second partition 30b is a thin metal plate with a bent end. The bent end is in contact with the housing 40 and attached to the housing 40 with a fastener. The main surface of the metal plate excluding the end faces the main surface of the first partition 30a.

The second partitions 30b are displaced from the first partition 30a in X-direction and attached to the housing 40. Each second partition 30b preferably extends from the position attached to the housing 40 to a position at which a part of the main surface faces a part of the first partition 30a. Thus, as illustrated in FIGS. 4 and 5, the main surface of the first partition 30a faces the main surfaces of the two second partitions 30b. More specifically, parts of the main surface of the first partition 30a are in contact with parts of the main surfaces of the two second partitions 30b. This structure suppresses broken pieces of one of the switching elements 12 and 22 coming in contact with the other switching elements 12 and 22.

As described above, the electronic device 1 according to Embodiment 1 includes the partition assembly 30 separating the switching elements 12 from the switching elements 22, and suppresses broken pieces of one of the switching elements 12 and 22 scattering and coming in contact with the other switching elements 12 and 22. This structure allows one of the first power converter 11 and the second power converter 21 to continue operating when the other one of the power converters 11 and 21 stops operating.

Embodiment 2

The partition assembly 30 may have any shape other than in the above example, and may have any shape that can suppress the electronic component scattering and coming in contact with the other electronic components. In an example, Embodiment 2 describes an electronic device 2 including two second partitions with different shapes. The electronic device 2 illustrated in FIG. 8, FIG. 9 that is a cross-sectional view taken along line IX-IX as viewed in the direction indicated by the arrows in FIG. 8, and FIG. 10 that is a cross-sectional view taken along line X-X as viewed in the direction indicated by the arrows in FIG. 8 differs from the electronic device 1 according to Embodiment 1 in including a partition assembly 31. The electronic device 2 is described below focusing on the differences between the electronic devices 1 and 2.

Figure 8:
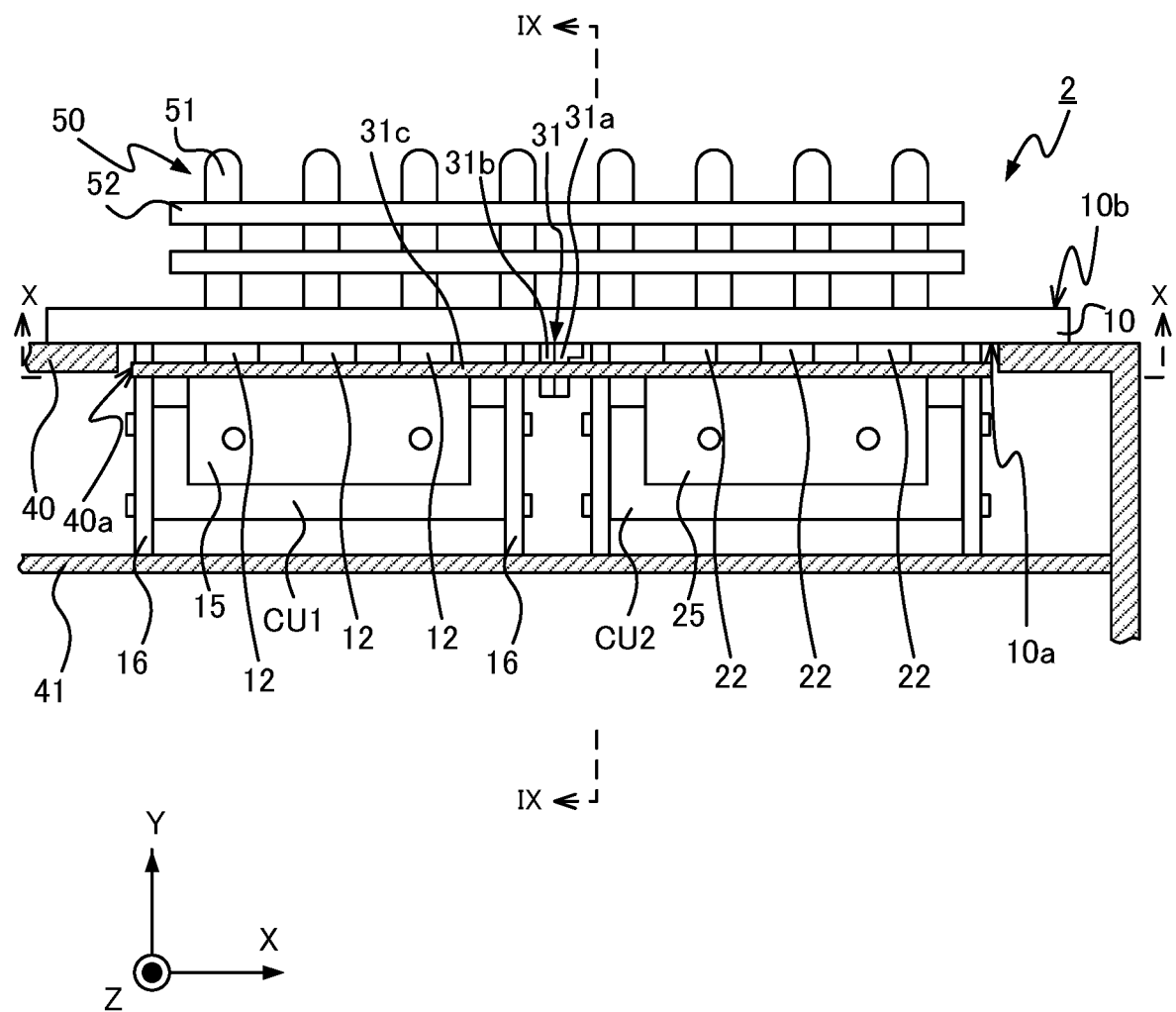
FIG. 8 is a cross-sectional view of an electronic device according to Embodiment 2.
Figure 9:
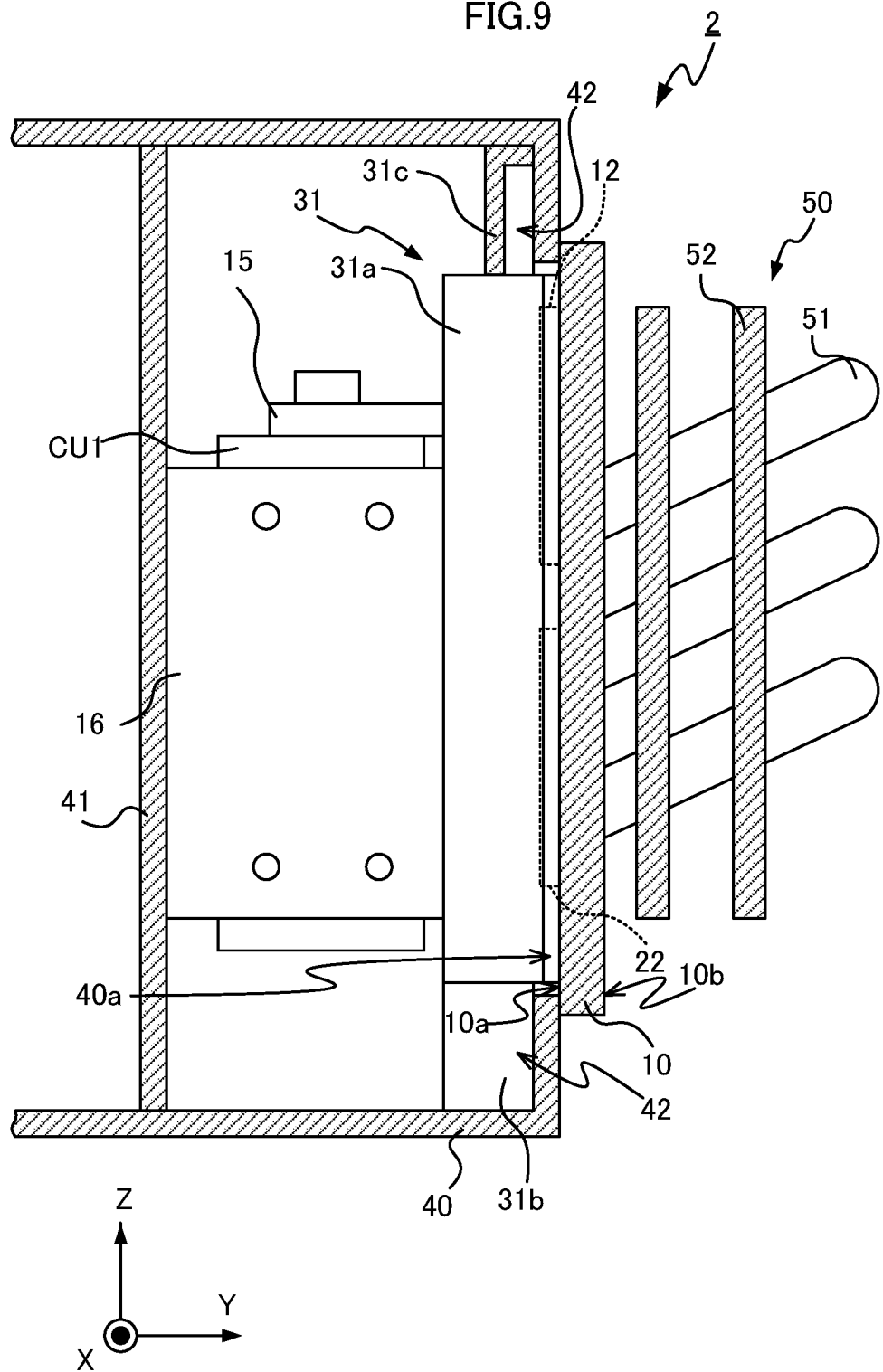
FIG. 9 is a cross-sectional view of the electronic device according to Embodiment 2 taken along line IX-IX as viewed in the direction indicated by the arrows in FIG. 8.
Figure 10:
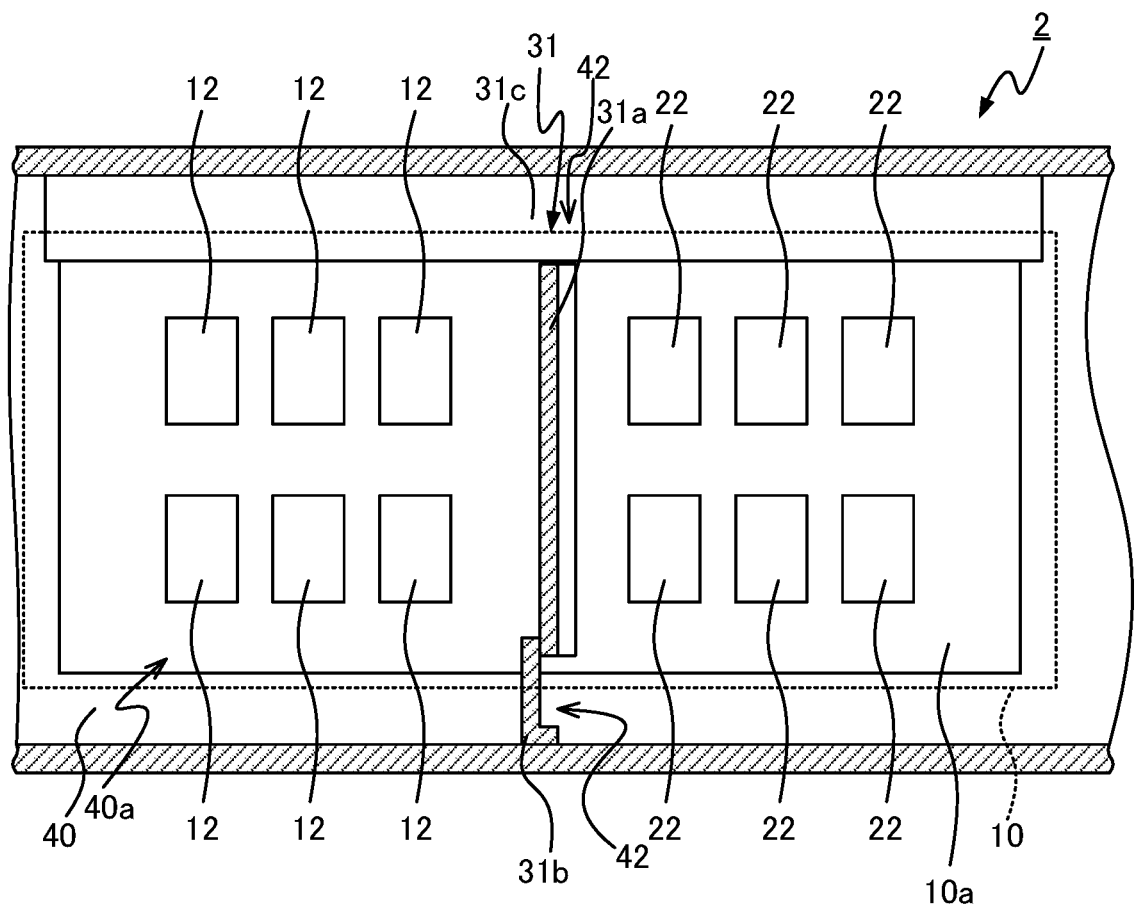
FIG. 10 is a cross-sectional view of the electronic device according to Embodiment 2 taken along line X-X as viewed in the direction indicated by the arrows in FIG. 8.

As illustrated in FIGS. 8 to 10, the partition assembly 31 includes a first partition 31a and second partitions 31b and 31c. The first partition 31a has the same shape as the first partition 30a included in the partition assembly 30 in the electronic device 1. The second partitions 31b and 31c are located adjacent to the first partition 31a and close at least parts of gaps between the first partition 31a and the housing 40.

In Embodiment 2, the second partitions 31b and 31c are plates holding the first partition 31a therebetween in Z-direction. Of the second partitions 31b and 31c, the second partition 31b located vertically downward has the same shape as one of the paired second partitions 30b included in the partition assembly 30 in the electronic device 1 located vertically downward, and closes the gap 42 between the housing 40 and the vertically lower end of the first partition 31a.

Of the second partitions 31b and 31c, the second partition 31c located vertically upward separates the electronic components attached to the base 10 from the other electronic components, or more specifically, the electronic components not attached to the base 10. More specifically, the main surface of the second partition 31c faces the surface of the housing 40 having the opening 40a. The longitudinal direction of the second partition 31c is aligned with X-direction. As illustrated in FIG. 10, in Embodiment 2, the second partition 31c has a dimension in X-direction greater than the dimension of the opening 40a in X-direction. As illustrated in FIG. 9, the side surface of the second partition 31c, or more specifically, the surface of the second partition 31c facing in the negative Z-direction faces the side surface of the first partition 31a, or more specifically, the surface of the first partition 31a facing in the positive Z-direction. In Embodiment 2, the surface of the second partition 31c facing in the negative Z-direction is in contact with the surface of the first partition 31a facing in the positive Z-direction.

The second partition 31c closes the gap 42 between the vertically upper end of the first partition 31a and the housing 40. More specifically, the second partition 31c suppresses broken pieces of the switching elements 12 or 22 passing through the gap 42 between the vertically upper end of the first partition 31a and the housing 40 in Y-direction. This structure suppresses broken pieces of the switching elements 12 or 22 coming in contact with, for example, a substrate on the surfaces of the capacitors CU1 and CU2 facing in the negative Y-direction, or more specifically, a substrate receiving a voltage sensor circuit, and damaging the substrate.

The second partition 31c is attached to the housing 40 by, for example, welding, bonding, or fastening with a fastener. In Embodiment 2, the second partition 31c is attached to a vertically upper portion of the housing 40. The second partition 31c preferably has strength enough to prevent scattering pieces of any electronic component from breaking through the second partition 31c. For example, the second partition 31c may be a metal plate with a thickness or a dimension in Y-direction of 1 to 5 mm inclusive.

More specifically, the second partition 31c is a thin metal plate with a bent end. The bent end is in contact with the housing 40 and attached to the housing 40 with a fastener. The main surface of the metal plate excluding the end faces the surface of the housing 40 having the opening 40a. The second partition 31c preferably extends from a position attached to the housing 40 to the vertically upper end of the first partition 31a. Thus, as illustrated in FIGS. 9 and 10, the vertically lower end of the second partition 31c is in contact with the vertically upper end of the first partition 31a. This structure suppresses broken pieces of one of the switching elements 12 and 22 coming in contact with other electronic components not attached to the base 10.

As described above, the electronic device 2 according to Embodiment 2 includes the partition assembly 31 that separates the switching elements 12 from the switching elements 22, and separates the switching elements 12 and 22 from other electronic components. This structure can suppress broken pieces of one of the switching elements 12 and 22 scattering and coming in contact with the other switching elements 12 and 22, and can suppress broken pieces of at least one of the switching elements 12 and 22 scattering and coming in contact with the other electronic components.

Embodiment 3

Figure 11:
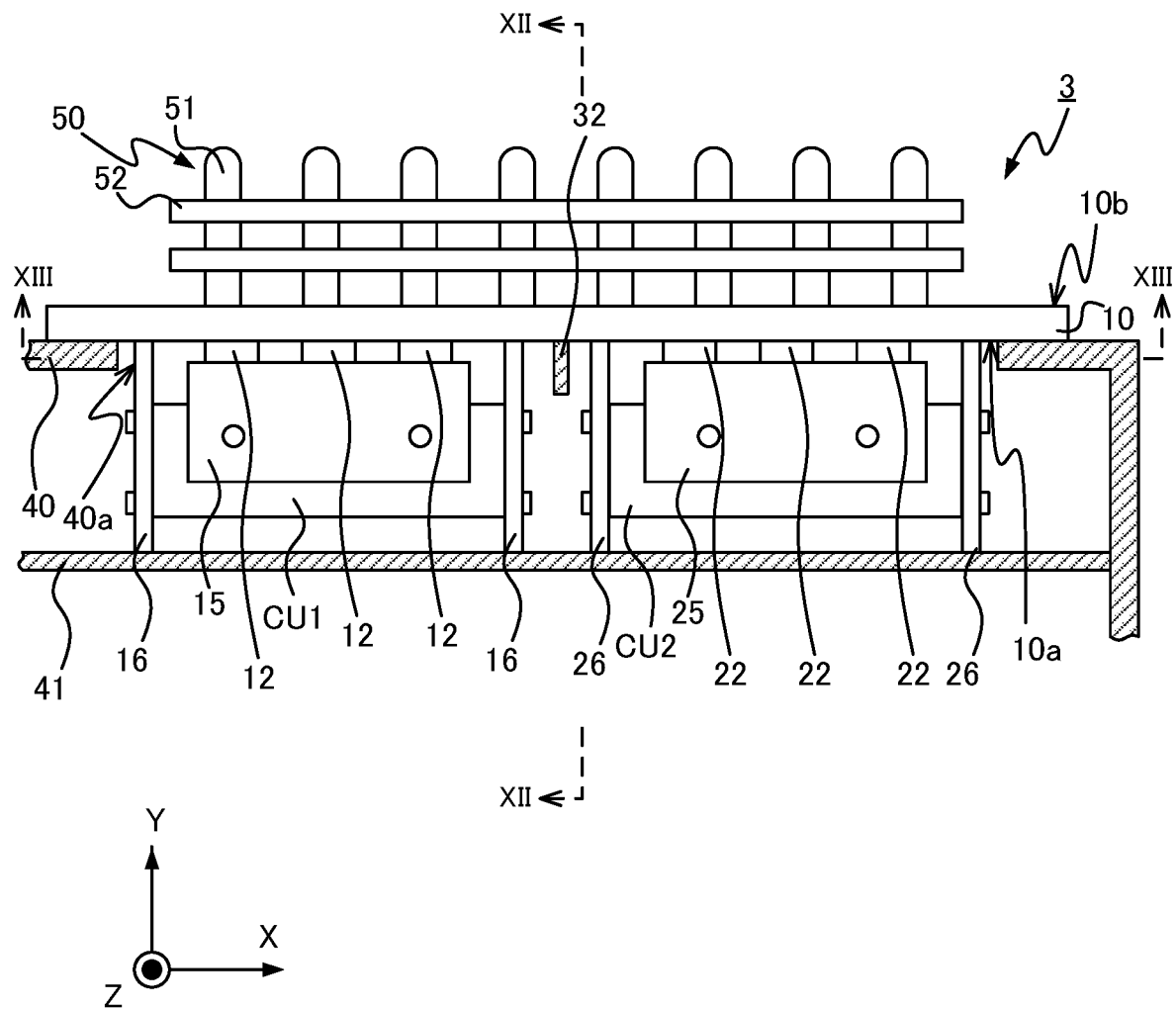
FIG. 11 is a cross-sectional view of an electronic device according to Embodiment 3.

The partition assemblies 30 and 31 may have any shapes other than in the above examples, and the first partition and the second partitions may be formed integrally. An electronic device 3 including a partition assembly 32 with a first partition and second partitions integrated with one another is described in Embodiment 3. The electronic device 3 illustrated in FIG. 11, FIG. 12 that is a cross-sectional view taken along line XII-XII as viewed in the direction indicated by the arrows in FIG. 11, FIG. 13 that is a cross-sectional view taken along line XIII-XIII as viewed in the direction indicated by the arrows in FIG. 11, and FIG. 14 differs from the electronic device 1 according to Embodiment 1 in including the partition assembly 32. The electronic device 3 is described below focusing on the differences between the electronic devices 1 and 3.

Figure 12:
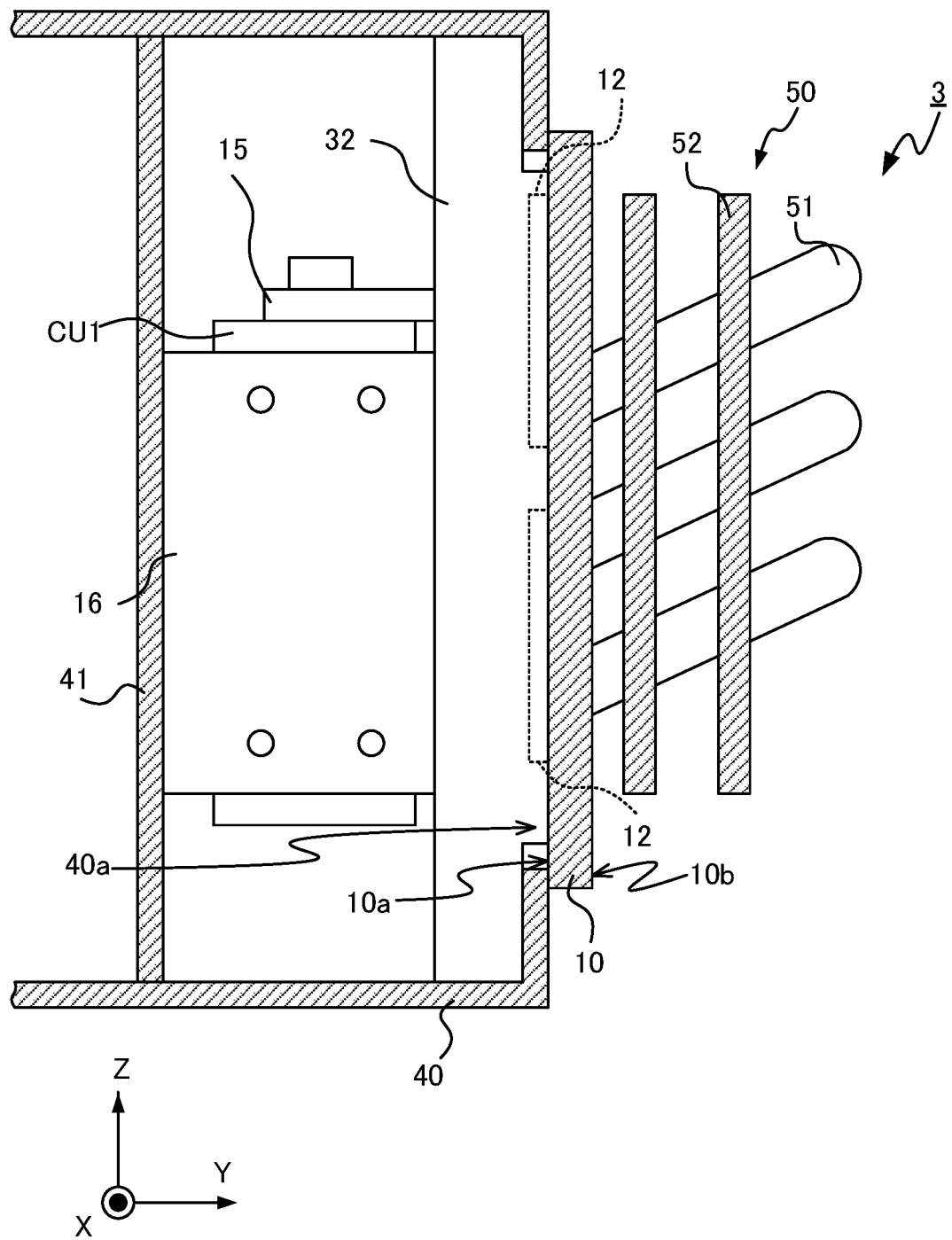
FIG. 12 is a cross-sectional view of the electronic device according to Embodiment 3 taken along line XII-XII as viewed in the direction indicated by the arrows in FIG. 11.
Figure 14:
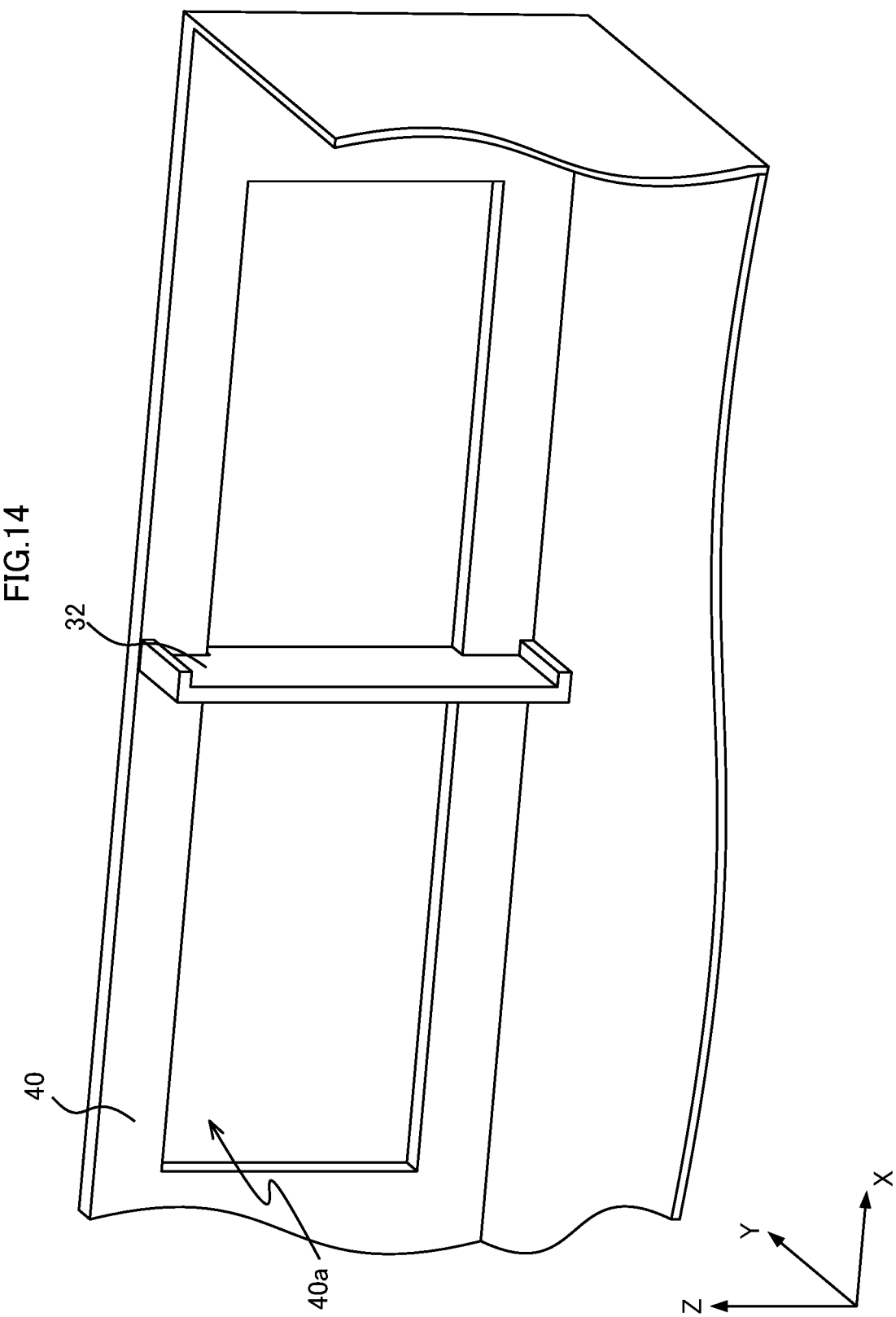
FIG. 14 is a perspective view of a housing and a partition assembly in Embodiment 3.

The partition assembly 32 to prevent scattering of electronic components separates at least one electronic component of at least two electronic components attached to the base 10 from another electronic component of at least two electronic components attached to the base 10. As illustrated in FIGS. 12 to 14, the partition assembly 32 is attached to a vertically upper portion and a vertically lower portion of the housing 40. One main surface of the partition assembly 32, or more specifically, the surface of the partition assembly 32 facing in the negative X-direction faces the switching elements 12. The other main surface of the partition assembly 32, or more specifically, the surface of the partition assembly 32 facing in the positive X-direction faces the switching elements 22. As described above, the partition assembly 32 extends from the vertically upper portion to the vertically lower portion of the housing 40 to separate the switching elements 12 from the switching elements 22.

As illustrated in FIGS. 12 and 14, preferably, the partition assembly 32 partially protrudes toward the opening 40a. More specifically, as illustrated in FIG. 12, the surface of the partition assembly 32 facing in the positive Y-direction is preferably in contact with the base 10 with the base 10 attached to the housing 40.

The partition assembly 32 preferably has strength enough to prevent scattering pieces of any electronic component from breaking through the partition assembly 32. For example, the partition assembly 32 may be a metal plate with a thickness or a dimension in X-direction of 1 to 5 mm inclusive.

More specifically, the partition assembly 32 is a thin metal plate with bent ends. As illustrated in FIG. 13, both the bent ends are in contact with the vertically upper portion and the vertically lower portion of the housing 40 and attached to the housing 40 by, for example, welding, bonding, or fastening with fasteners. One main surface of the metal plate excluding both the ends faces the switching elements 12, and the other main surface of the metal plate excluding both the ends faces the switching elements 22. The partition assembly 32 formed from highly thermally conductive metal dissipates heat of air in the housing 40 into air around the cooler 50 from the cooler 50 through the partition assembly 32 and the base 10, and thus can cool the air in the housing 40.

As described above, the electronic device 3 according to Embodiment 3 includes the partition assembly 32 that separates the switching elements 12 from the switching elements 22, and thus can suppress broken pieces of one of the switching elements 12 and 22 scattering and coming in contact with the other switching elements 12 and 22.

Figure 15:
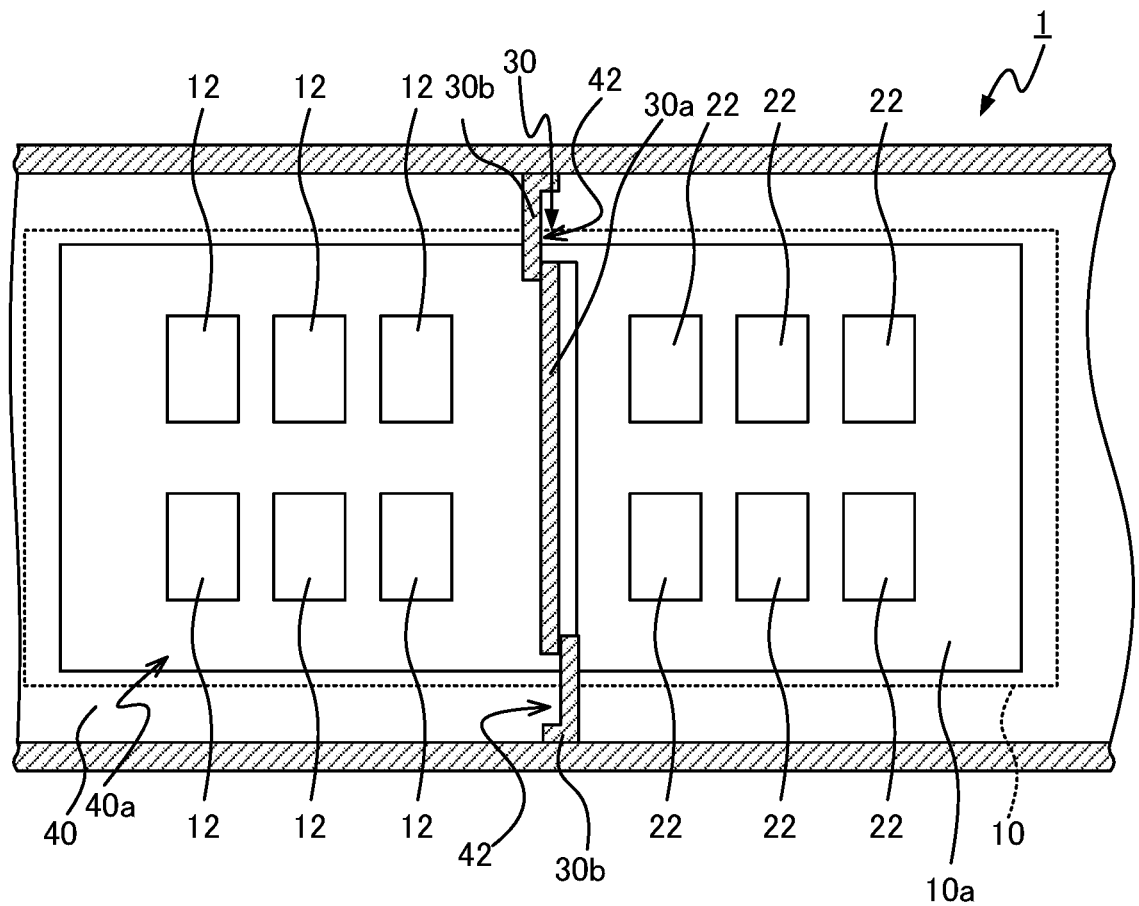
FIG. 15 is a cross-sectional view of an electronic device according to a first modification of an embodiment.

The present disclosure is not limited to the above embodiments. The partition assemblies 30 to 32 may have any shape other than in the above examples, and may have any shape that can suppress an electronic component scattering and coming in contact with another electronic component. In an example, as illustrated in FIG. 15, the two second partitions 30b included in the partition assembly 30 in the electronic device 1 may be located across the first partition 30a in X-direction. In this case, the first partition 30a has one main surface facing the main surface of the second partition 30b located vertically upward, and the other main surface facing the main surface of the second partition 30b located vertically downward. In the example illustrated in FIG. 15, a part of one main surface of the first partition 30a is in contact with a part of the main surface of the second partition 30b located vertically upward, and a part of the other main surface of the first partition 30a is in contact with a part of the main surface of the second partition 30b located vertically downward.

Figure 16:
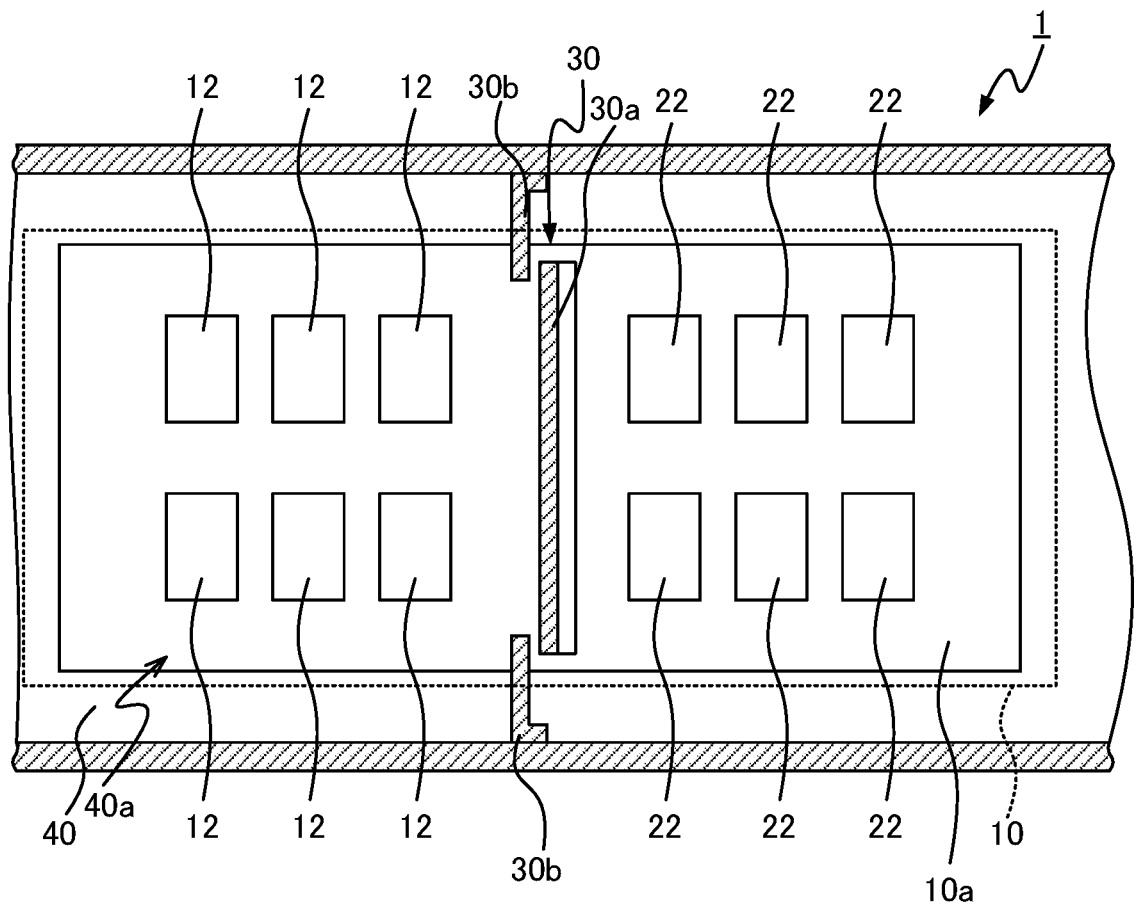
FIG. 16 is a cross-sectional view of an electronic device according to a second modification of an embodiment.

In Embodiment 1, parts of the main surface of the first partition 30a are in contact with parts of the main surfaces of the two second partitions 30b. In some embodiments, as illustrated in FIG. 16, the first partition 30a and the second partitions 30b may be separate from one another in X-direction. In this case, the first partition 30a and the second partitions 30b is preferably located adjacent to one another enough to block broken pieces of the switching elements 12 or 22 that are to pass through between the first partition 30a and the second partitions 30b.

Figure 17:
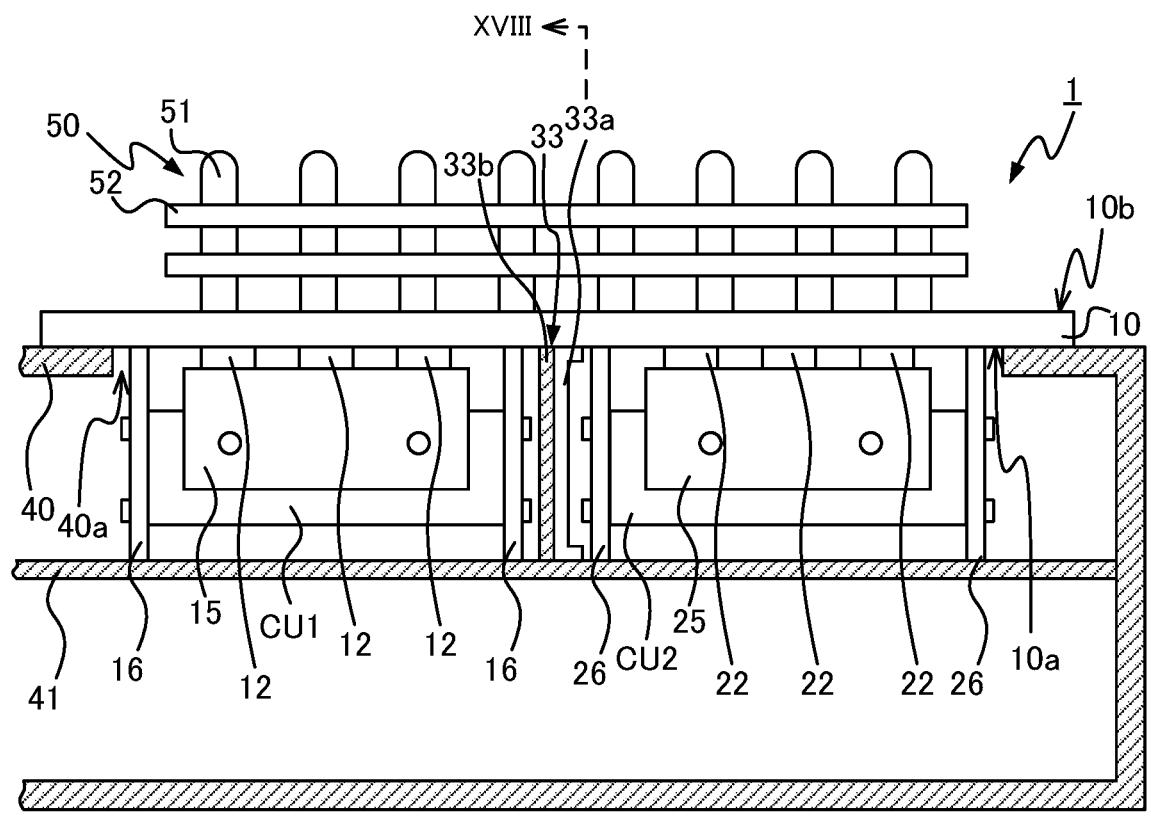
FIG. 17 is a cross-sectional view of an electronic device according to a third modification of an embodiment.
Figure 18:
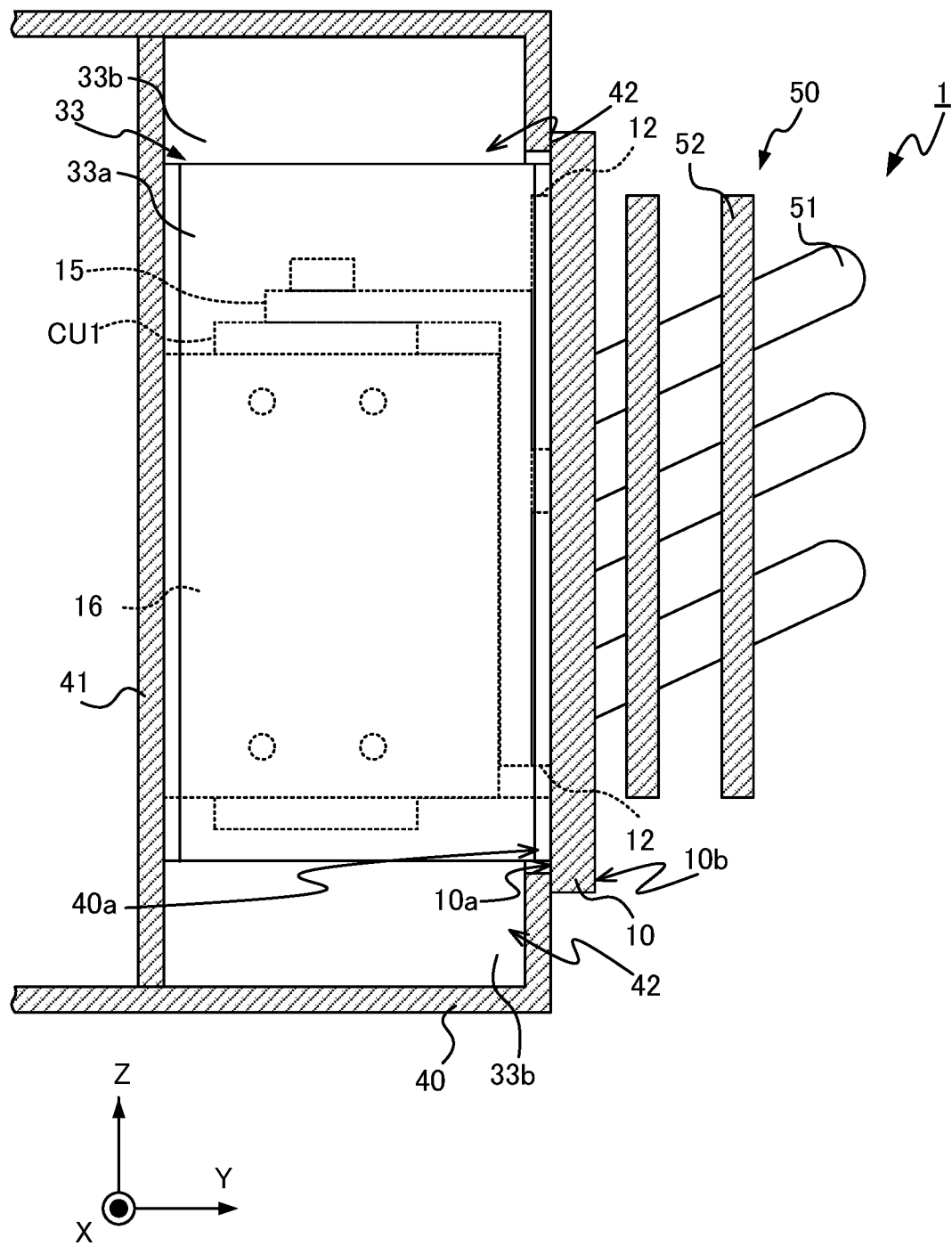
FIG. 18 is a cross-sectional view of the electronic device according to the third modification of the embodiment taken along line XVIII-XVIII as viewed in the direction indicated by the arrows in FIG. 17.

To suppress broken pieces of any electronic component scattering and coming in contact with another electronic component, the partition assemblies 30 to 32 may be larger than partition assemblies in the above embodiments. In an example, as illustrated in FIG. 17 and FIG. 18 that is a cross-sectional view taken along line XVIII-XVIII as viewed in the direction indicated by the arrows in FIG. 17, a partition assembly 33 included in the electronic device 1 includes a first partition 33a and two second partitions 33b extending to the fixing frame 41.

The first partition 33a has a shape corresponding to the shape of the first partition 30a extended to the fixing frame 41. One main surface of the first partition 33a, or more specifically, the surface of the first partition 33a facing in the negative X-direction faces the switching elements 12. The other main surface of the first partition 33a, or more specifically, the surface of the first partition 33a facing in the positive X-direction faces the switching elements 22.

More specifically, the first partition 33a is a thin metal plate with bent ends. The bent ends are in contact with the base 10 and the fixing frame 41 and attached to the base 10 and the fixing frame 41 by, for example, welding, bonding, or fastening with fasteners. More specifically, when the base 10 receiving the first partition 33a is attached to the outer surface of the housing 40, the first partition 33a comes in contact with the fixing frame 41. Thus, the first partition 33a is attached to the fixing frame 41.

The main surface of the metal plate excluding both the ends faces the main surface of each second partition 33b. The first partition 33a formed from highly thermally conductive metal dissipates heat of air in the housing 40 into air around the cooler 50 from the cooler 50 through the first partition 33a and the base 10, and thus can cool the air in the housing 40.

Each second partition 33b has a shape corresponding to the shape of the second partition 30b extended to the fixing frame 41. Each second partition 33b is attached to the housing 40 and closes at least a part of the corresponding gap between the first partition 33a and the housing 40. In the example of FIGS. 17 and 18, the gaps between the first partition 33a and the housing 40 correspond to the gap 42 between the vertically upper end of the first partition 33a and the housing 40 and the gap 42 between the vertically lower end of the first partition 33a and the housing 40. One of the second partitions 33b closes the gap 42 between the vertically upper end of the first partition 33a and the housing 40. The other of the second partitions 33b closes the gap 42 between the vertically lower end of the first partition 33a and the housing 40.

Each second partition 33b is attached to the housing 40 and the fixing frame 41 by, for example, welding, bonding, or fastening with a fastener. One of the second partitions 33b is attached to a vertically upper portion of the housing 40, the surface having the opening 40a, and the fixing frame 41. The other of the second partitions 33b is attached to a vertically lower portion of the housing 40, the surface having the opening 40a, and the fixing frame 41. The second partitions 33b preferably have strength enough to prevent scattering pieces of any electronic component from breaking through the second partitions 33b. For example, the second partition 33b may be a metal plate with a thickness or a dimension in X-direction of 1 to 5 mm inclusive.

More specifically, each second partition 33b is a thin metal plate with a bent end. The bent end is in contact with the housing 40 and the fixing frame 41 and attached to the housing 40 and the fixing frame 41 with a fastener. The main surface of the metal plate excluding the end faces the main surface of the first partition 33a.

As described above, the first partition 33a extends from the base 10 to the fixing frame 41, and the second partitions 33b extend from the surface of the housing 40 having the opening 40a to the fixing frame 41. Thus, the gaps between the first partition 33a and the housing 40 are smaller than the gaps in the electronic device 1. This structure more reliably suppresses broken pieces of one of the switching elements 12 and 22 coming in contact with the other switching elements 12 and 22.

Similarly, the first partition 31a included in the partition assembly 31 and the partition assembly 32 may extend from the base 10 to the fixing frame 41, and the second partition 31b included in the partition assembly 31 may extend from the surface of the housing 40 having the opening 40a to the fixing frame 41.

Figure 20:
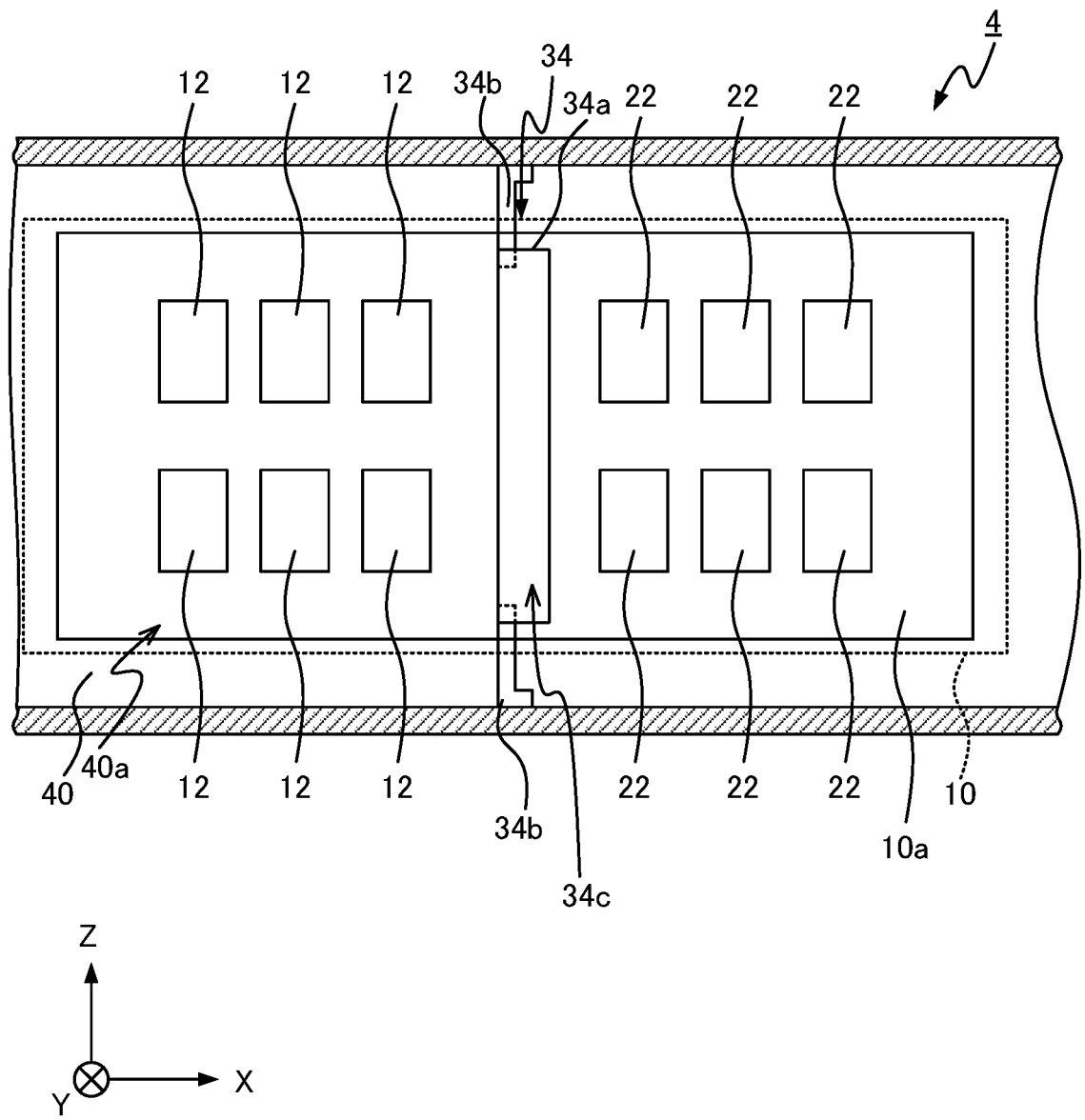
FIG. 20 is a cross-sectional view of the electronic device according to the fourth modification of the embodiment taken along line XX-XX as viewed in the direction indicated by the arrows in FIG. 19.

To suppress Y-direction movement of pieces hitting any of the partition assemblies 30 to 32, the partition assemblies 30 to 32 may each include a protrusion protruding in X-direction. A partition assembly 34 included in an electronic device 4 illustrated in FIG. 19 and FIG. 20 that is a cross-sectional view taken along line XX-XX as viewed in the direction indicated by the arrows in FIG. 19 includes a first partition 34a including protrusions 34c, and two second partitions 34b. More specifically, the first partition 34a includes the protrusions 34c protruding in X-direction from two main surfaces of the first partition 34a. The protrusions 34c suppress movement of pieces hitting the first partition 34a in the negative Y-direction from the first partition 34a. The second partitions 34b have the same shape as the second partitions 30b.

Figure 21:
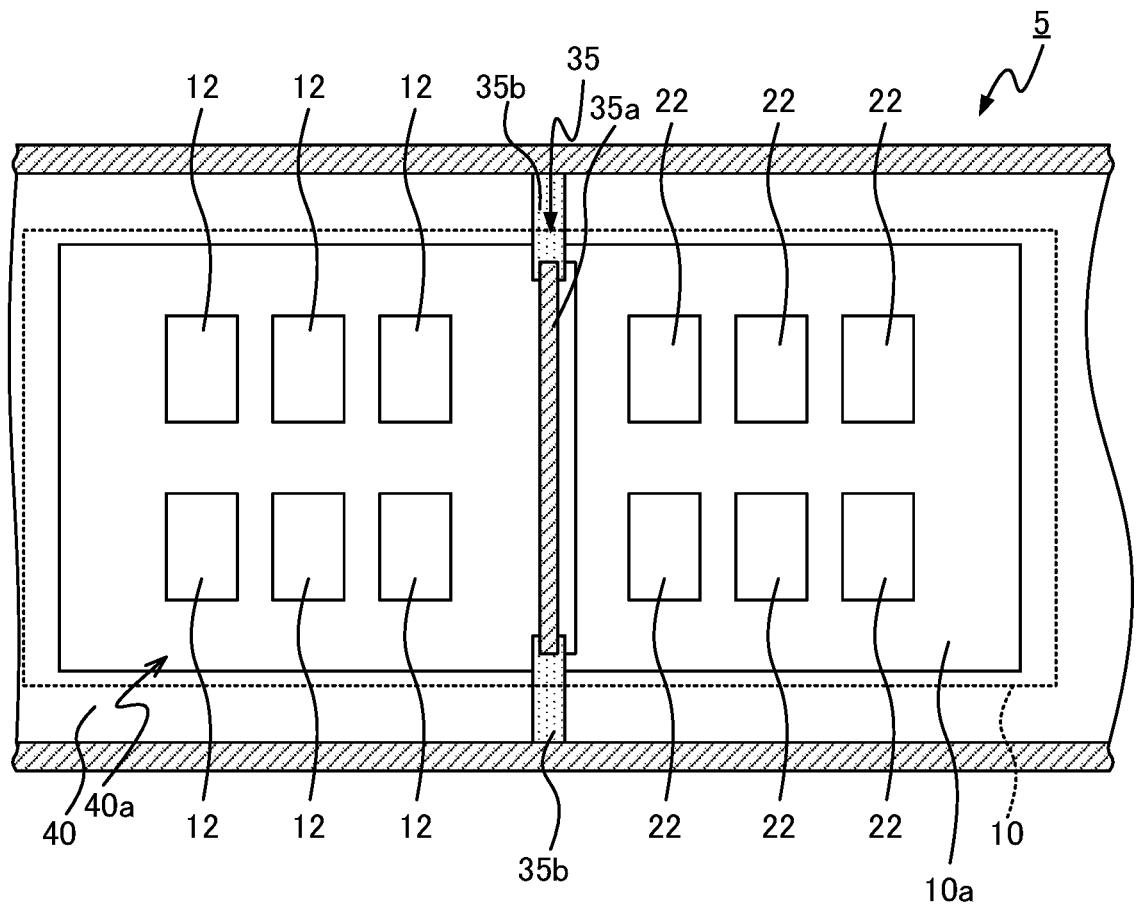
FIG. 21 is a cross-sectional view of an electronic device according to a fifth modification of an embodiment.

In Embodiment 1, the first partition 30a and the second partitions 30b are in contact with one another. In some embodiments, the first partition 30a and the second partitions 30b may be fitted to one another. A partition assembly 35 included in an electronic device 5 illustrated in FIG. 21 includes a first partition 35a having the same shape as the first partition 30a, and two second partitions 35b that hold the first partition 35a therebetween in Z-direction to be fitted to the first partition 35a. The second partitions 35b are formed from a material that deforms when pressed, such as an elastic material. Thus, the first partition 35a and the second partitions 35b can be fitted to one another independently of manufacturing tolerances of the first partition 35a.

Figure 22:
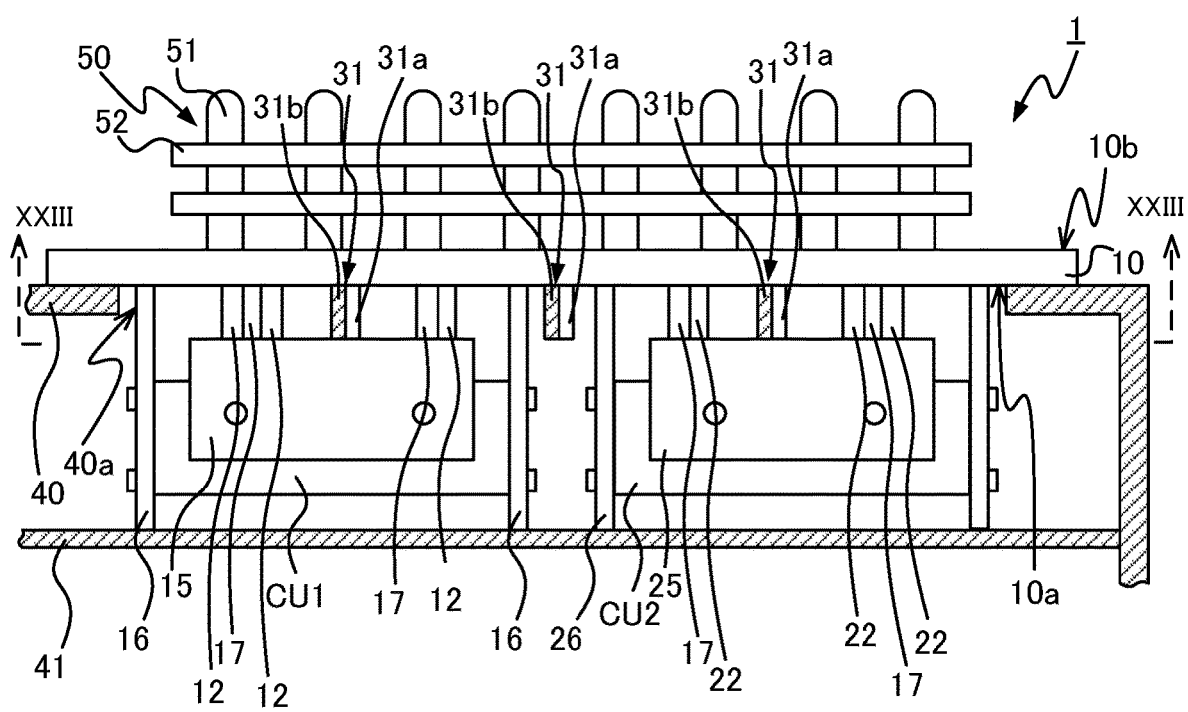
FIG. 22 is a cross-sectional view of an electronic device according to a sixth modification of an embodiment.
Figure 23:
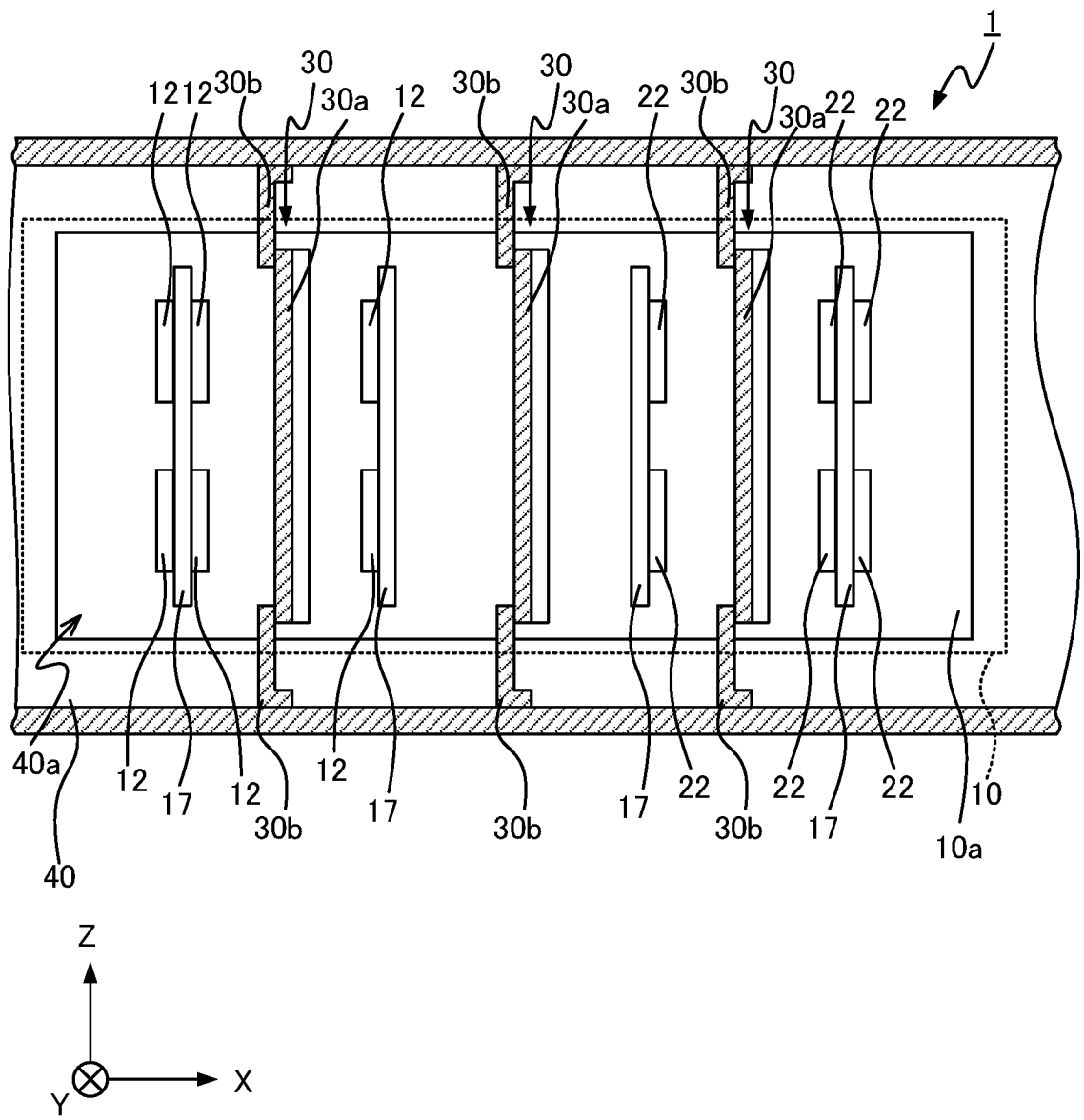
FIG. 23 is a cross-sectional view of the electronic device according to the sixth modification of the embodiment taken along line XXIII-XXIII as viewed in the direction indicated by the arrows in FIG. 22.

The switching elements 12 and 22 may be attached to the base 10 with any method other than the above method. In the above embodiments, the switching elements 12 and 22 are directly attached to the base 10, but may be indirectly attached to the base 10. More specifically, as illustrated in FIG. 22 and FIG. 23 that is a cross-sectional view taken along line XXIII-XXIII as viewed in the direction indicated by the arrows in FIG. 22, the switching elements 12 and 22 in the electronic device 1 may be attached to fixing members 17 attached to the base 10. In the example illustrated in FIGS. 22 and 23, four fixing members 17 are attached to the base 10. Each fixing member 17 is a plate having a side surface in contact with the base 10 and is attached to the base 10 by, for example, welding, bonding, or fastening with a fastener.

The switching elements 12 and 22 are attached to the main surfaces of the fixing members 17. More specifically, two switching elements 12 or 22 are attached to at least one main surface of the corresponding fixing member 17.

One partition assembly 30 is located between two fixing members 17 adjacent to each other. More specifically, three partition assemblies 30 are located between the four fixing members 17. The partition assemblies 30 suppress broken pieces of one of the switching elements 12 and 22 attached to the corresponding fixing members 17 scattering and coming in contact with the other one of the switching elements 12 and 22. At least one of the partition assemblies 30 to 35 may be located between the four fixing members 17. For example, the partition assemblies 30, 31, and 32 may be located between the four fixing members 17.

Each of the electronic devices 1 to 5 is not limited to a standby redundant DC-three-phase converter, and may be any electronic device accommodating electronic components in the housing 40. In an example, the first power converter 11 and the second power converter 21 may be connected to separate loads. In another example, the electronic devices 1 to 5 may each be a standby redundant converter that converts three-phase AC power to DC power. In still another example, the electronic devices 1 to 5 may each include multiple electronic circuits connected to a common power source parallel to one another. In this case, each of the partition assemblies 30 to 35 may separate an electronic component included in at least one of the electronic circuits from an electronic component included in another of the electronic circuits.

The electronic devices 1 to 5 may be installed in any movable body such as an automobile, an aircraft, or a vessel, rather than a railway vehicle, or installed at any stationary location.

Any shape and any number of first attachments 16 and second attachments 26 may be used. The first attachments 16 and the second attachments 26 may have any shape that can attach the capacitors CU1 and CU2 to the base 10. In an example, the electronic device 1 may include four rod-like first attachments 16 and four rod-like second attachments 26. In another example, the electronic device 1 may include four pillar-like first attachments 16 and four pillar-like second attachments 26.

The cooler 50 may have any structure other than in the above examples, and the cooler 50 may have any structure that can cool the electronic components. In an example, the cooler 50 may include multiple heat transferrers including metal rods attached to the base 10 and extending away from the base 10, and multiple fins 52 attached to the heat transferrers.

The capacitors CU1 and CU2 may be arranged in any manner other than in the above examples. In an example, the electronic devices 1 to 5 may each include the capacitors CU1 and CU2 adjacent to each other in Z-direction.

Any number of power converters other than in the above examples may be used. The first power converter 11 may include any number of the switching elements 12 other than in the above examples, and the second power converter 21 may include any number of switching elements 22 other than in the above examples.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

REFERENCE SIGNS LIST 1, 2, 3, 4, 5 Electronic device
1a Positive input terminal
1b Negative input terminal
1c, 1d, 1e Output terminal
10 Base
10a First main surface
10b Second main surface
11 First power converter
12, 22 Switching element
13, 23 IGBT
14, 24 Freewheeling diode
15, 25 Busbar
16 First attachment
17 Fixing member
21 Second power converter
26 Second attachment
30, 31, 32, 33, 34, 35 Partition assembly
30a, 31a, 33a, 34a, 35a First partition
30b, 31b, 31c, 33b, 34b, 35b Second partition
34c Protrusion
40 Housing
40a Opening
41 Fixing frame
42 Gap
50 Cooler
51 Heat pipe
52 Fin
61 Load
CU1, CU2 Capacitor
MC1, MC2 Contactor

The invention claimed is:

1. An electronic device, comprising:
a housing accommodating a plurality of electronic components;
a base that is removably attached to the housing and to which at least two of the plurality of electronic components are attached; and
a partition assembly separating at least one electronic component of the at least two electronic components attached to the base from another electronic component of the at least two electronic components attached to the base,
wherein the partition assembly includes a first partition and a second partition, the first partition has one main surface facing at least one electronic component of the at least two electronic components and another main surface facing the another electronic component of the at least two electronic components, and the second partition is located adjacent to the first partition and closes at least a part of a gap between a side surface of the first partition and the housing.

2. The electronic device according to claim 1, further comprising:
a cooler to dissipate heat transferred from the at least two electronic components attached to the base,
wherein the housing has an opening, and
the base is a heat conductive plate having a first main surface and a second main surface opposite to the first main surface, the at least two electronic components are attached to the first main surface, the cooler is attached to the second main surface, and the base is attached to the housing, with the first main surface closing the opening in the housing.

3. The electronic device according to claim 1, wherein the first partition is attached to the base.

4. The electronic device according to claim 2, wherein the first partition is attached to the base.

5. The electronic device according to claim 3, wherein the partition assembly includes
the first partition being a plate extending away from the base, and
two of the second partitions being plates holding the first partition between the two second partitions in a direction along the main surfaces of the first partition.

6. The electronic device according to claim 4, wherein the partition assembly includes
the first partition being a plate extending away from the base, and
two of the second partitions being plates holding the first partition between the two second partitions in a direction along the main surfaces of the first partition.

7. The electronic device according to claim 5, wherein one of the main surfaces of the first partition faces main surfaces of the two second partitions.

8. The electronic device according to claim 6, wherein one of the main surfaces of the first partition faces main surfaces of the two second partitions.

9. The electronic device according to claim 5, wherein one of the main surfaces of the first partition is in contact with main surfaces of the two second partitions.

10. The electronic device according to claim 6, wherein one of the main surfaces of the first partition is in contact with main surfaces of the two second partitions.

11. The electronic device according to claim 5, wherein the first partition is fitted to the two second partitions.

12. The electronic device according to claim 6, wherein the first partition is fitted to the two second partitions.

13. The electronic device according to claim 5, wherein the two second partitions hold the first partition between the two second partitions in a vertical direction, and an upper second partition of the two second partitions in the vertical direction separates the at least two of the plurality of electronic components attached to the base from the plurality of electronic components excluding the at least two electronic components.

14. The electronic device according to claim 6, wherein
the two second partitions hold the first partition between the two second partitions in a vertical direction, and
an upper second partition of the two second partitions in the vertical direction separates the at least two of the plurality of electronic components attached to the base from the plurality of electronic components excluding the at least two electronic components.

15. The electronic device according to claim 13, wherein the upper second partition has a main surface facing a surface of the housing having an opening.

16. The electronic device according to claim 13, wherein a lower second partition of the two second partitions in the vertical direction has a main surface facing one of the main surfaces of the first partition.

17. The electronic device according to claim 1, wherein the first partition and the second partition are integral with each other.

18. The electronic device according to claim 1, further comprising:
a plurality of electronic circuits connected in parallel to one another and each including an electronic component,
wherein the electronic component in each of the plurality of electronic circuits is attached to the base, and
the partition assembly separates the electronic component included in at least one of the plurality of electronic circuits from the electronic component included in another of the plurality of electronic circuits.

19. The electronic device according to claim 18, wherein
the plurality of electronic circuits include first power converting circuitry including a capacitor and a plurality of switching elements to convert power, and second power converting circuitry connected in parallel to the first power converting circuitry and including a capacitor and a plurality of switching elements to convert power,
the plurality of switching elements included in the first power converting circuitry and the plurality of switching elements included in the second power converting circuitry are directly attached to the base,
the capacitor included in the first power converting circuitry is attached to the base with a first attachment, with the plurality of switching elements held between the capacitor and the base,
the capacitor included in the second power converting circuitry is attached to the base with a second attachment, with the plurality of switching elements held between the capacitor and the base, and
the first partition has one main surface facing the plurality of switching elements included in the first power converting circuitry, and another main surface facing the plurality of switching elements included in the second power converting circuitry.

20. An electronic device, comprising:
a housing accommodating a plurality of electronic components;
a base that is removably attached to the housing and to which at least two of the plurality of electronic components are attached; and
a partition assembly separating at least one electronic component of the at least two electronic components attached to the base from another electronic component of the at least two electronic components attached to the base,
wherein the partition assembly includes a first partition and a second partition, the first partition is located to separate the at least one electronic component of the at least two electronic components from the another electronic component of the at least two electronic components, and the second partition is located adjacent to the first partition and closes at least a part of a gap between the first partition and the housing, and
the first partition and the second partition are integral with each other.

* * * * *